(12) United States Patent
Bowman

(10) Patent No.: US 11,916,352 B2
(45) Date of Patent: Feb. 27, 2024

(54) POINTING DEVICES, APPARATUS, SYSTEMS AND METHODS FOR HIGH SHOCK ENVIRONMENTS

(71) Applicant: Orval E. Bowman, Chuluota, FL (US)

(72) Inventor: Orval E. Bowman, Chuluota, FL (US)

( * ) Notice: Subject to any disclaimer, the term of this patent is extended or adjusted under 35 U.S.C. 154(b) by 287 days.

(21) Appl. No.: 17/355,903

(22) Filed: Jun. 23, 2021

(65) Prior Publication Data
US 2021/0320472 A1    Oct. 14, 2021

Related U.S. Application Data

(60) Continuation of application No. 16/444,302, filed on Jun. 18, 2019, now Pat. No. 11,050,216, which is a
(Continued)

(51) Int. Cl.
*H01S 5/0231* (2021.01)
*F41G 11/00* (2006.01)
(Continued)

(52) U.S. Cl.
CPC ............ *H01S 5/0231* (2021.01); *F41G 1/00* (2013.01); *F41G 1/34* (2013.01); *F41G 1/35* (2013.01);
(Continued)

(58) Field of Classification Search
CPC ...... H01S 3/025; H01S 5/0231; H01S 5/0239; H01S 5/022; F41G 1/00; F41G 1/32;
(Continued)

(56) References Cited

U.S. PATENT DOCUMENTS

| 58,317 A | 12/1866 | Stiles |
|---|---|---|
| 2,189,766 A | 2/1940 | Unerti |

(Continued)

FOREIGN PATENT DOCUMENTS

| DE | 2954697 C2 | 3/2000 |
|---|---|---|
| EP | 1156296 A1 | 11/2001 |

(Continued)

OTHER PUBLICATIONS

Bowman, PCT Serial No. PCT/US12/32833 filed Apr. 10, 2012, Notification of Transmittal of the International Search Report and the Written Opinion of the International Searching Authority, or the Declaration dated Mar. 28, 2013, 10 pages.
(Continued)

*Primary Examiner* — Joshua E Freeman
*Assistant Examiner* — Benjamin S Gomberg
(74) *Attorney, Agent, or Firm* — Brian S. Steinberger; Hilary F. Steinberger; Law Offices of Brian S. Steinberger, P.A.

(57) ABSTRACT

Devices, apparatus, systems and methods for providing accurate linear and angular positioning with a payload mounted to a beam having freely moveable ends. The payload can be a laser pointer mounted on a firearm, which maintains the initial precise pointing during and after exposure in high G shock and vibration environments. Vertical and lateral adjustment controls can adjust minute changes in beam orientation. Precision adjustments can be performed in a zero G, one G, or high G environment and maintains the adjustment during and after being exposed to a high G shock or vibration environment.

19 Claims, 29 Drawing Sheets

Parabola – Parabolic Profile

Related U.S. Application Data division of application No. 15/474,449, filed on Mar. 30, 2017, now Pat. No. 10,367,331, which is a division of application No. 14/577,179, filed on Dec. 19, 2014, now Pat. No. 9,638,493, which is a continuation-in-part of application No. 14/513,809, filed on Oct. 14, 2014, now Pat. No. 9,270,082, which is a division of application No. 14/089,041, filed on Nov. 25, 2013, now Pat. No. 9,077,139, which is a division of application No. 13/442,425, filed on Apr. 9, 2012, now Pat. No. 8,826,582.

(60) Provisional application No. 61/629,737, filed on Nov. 26, 2011.

(51) Int. Cl.
| | |
|---|---|
| *F41G 1/387* | (2006.01) |
| *H01S 5/0239* | (2021.01) |
| *H01S 3/02* | (2006.01) |
| *F41G 1/35* | (2006.01) |
| *F41G 1/00* | (2006.01) |
| *F41G 1/34* | (2006.01) |
| *F41G 1/36* | (2006.01) |

(52) U.S. Cl.
CPC ............ *F41G 1/387* (2013.01); *F41G 11/005* (2013.01); *H01S 3/025* (2013.01); *H01S 5/0239* (2021.01); *F41G 1/36* (2013.01)

(58) Field of Classification Search
CPC ..... F41G 1/34; F41G 1/35; F41G 1/36; F41G 11/005
USPC .......................................................... 42/114
See application file for complete search history.

(56) References Cited

U.S. PATENT DOCUMENTS

| | | |
|---|---|---|
| 2,440,260 A | 4/1948 | Gall |
| 2,817,968 A | 12/1957 | Schmitz, Jr. |
| 3,096,655 A | 7/1963 | Peterson |
| 3,159,079 A | 12/1964 | Hildebrand |
| 3,189,775 A | 6/1965 | Fyler |
| 3,205,580 A | 9/1965 | Osborn |
| 3,476,349 A | 11/1969 | Smith |
| 3,596,863 A | 8/1971 | Kaspareck |
| 4,066,341 A | 1/1978 | Schubert |
| 4,079,534 A | 3/1978 | Snyder |
| 4,161,076 A | 7/1979 | Snyder |
| 4,212,109 A | 7/1980 | Snyder |
| 4,266,873 A | 5/1981 | Hacskaylo |
| 4,295,289 A | 10/1981 | Snyder |
| 4,313,272 A | 2/1982 | Matthews |
| 4,475,788 A | 10/1984 | Tomassini et al. |
| 4,686,440 A | 8/1987 | Hatamura et al. |
| 4,734,912 A | 3/1988 | Scerbak et al. |
| 4,738,044 A | 4/1988 | Osterhout |
| 4,858,794 A | 8/1989 | Sugiura et al. |
| 4,876,816 A | 10/1989 | Triplett |
| 4,916,713 A | 4/1990 | Gerber |
| 4,958,794 A | 9/1990 | Brewer |
| 5,033,219 A | 7/1991 | Johnson et al. |
| 5,287,371 A | 2/1994 | Bournes |
| 5,299,375 A | 4/1994 | Thummel et al. |
| 5,345,323 A | 9/1994 | Basavanhally et al. |
| 5,351,330 A | 9/1994 | Jongewaard |
| 5,374,986 A | 12/1994 | Solinsky |
| 5,400,540 A | 3/1995 | Solinsky et al. |
| 5,400,674 A | 3/1995 | Arnone et al. |
| 5,446,591 A | 8/1995 | Medlock |
| 5,476,385 A | 12/1995 | Parikh et al. |
| 5,509,226 A | 4/1996 | Houde-Walter |
| 5,531,040 A | 7/1996 | Moore |
| 5,584,569 A | 12/1996 | Huang |
| 5,685,106 A | 11/1997 | Shoham |
| 5,738,595 A | 4/1998 | Carney |
| 6,295,753 B1 | 10/2001 | Thummel |
| 6,378,237 B1 | 4/2002 | Matthews et al. |
| 6,640,481 B1 | 11/2003 | Williams, Jr. |
| 6,705,037 B2 | 3/2004 | Van Kirk |
| 6,714,564 B1 | 3/2004 | Meyers |
| 6,714,584 B1 | 3/2004 | Ishii et al. |
| 6,722,048 B2 | 4/2004 | Huang et al. |
| 6,793,494 B2 | 9/2004 | Varshneya et al. |
| 6,887,079 B1 | 5/2005 | Robertsson et al. |
| 7,014,369 B2 | 3/2006 | Alcock et al. |
| 7,331,137 B2 | 2/2008 | Hsu |
| 7,418,894 B2 | 9/2008 | Ushiwata et al. |
| 7,472,830 B2 | 1/2009 | Danielson |
| 7,531,972 B1 | 5/2009 | Worsham et al. |
| 7,558,168 B2 | 7/2009 | Chen |
| 7,726,061 B1 | 6/2010 | Thummel |
| 7,739,823 B2 | 6/2010 | Shapira et al. |
| 7,753,549 B2 | 7/2010 | Solinsky et al. |
| 7,886,644 B2 | 2/2011 | Ushiwata et al. |
| 7,922,491 B2 | 4/2011 | Jones et al. |
| 7,926,218 B2 | 4/2011 | Matthews et al. |
| 7,936,511 B2 | 5/2011 | Meyers et al. |
| 8,826,582 B2 | 9/2014 | Bowman |
| 9,077,139 B1 | 7/2015 | Bowman |
| 9,270,082 B2 | 2/2016 | Bowman |
| 9,638,493 B2 | 5/2017 | Bowman |
| 10,367,331 B2 | 7/2019 | Bowman |
| 11,050,216 B2 * | 6/2021 | Bowman ............... H01S 5/0239 |
| 2001/0000130 A1 | 4/2001 | Aoki |
| 2002/0013400 A1 | 1/2002 | Hille |
| 2002/0141196 A1 | 10/2002 | Camarota |
| 2003/0204959 A1 | 4/2003 | Hall |
| 2004/0005531 A1 | 1/2004 | Varshneya et al. |
| 2004/0161197 A1 | 8/2004 | Pelletier et al. |
| 2005/0252061 A1 | 11/2005 | Sloan et al. |
| 2006/0156556 A1 | 7/2006 | Nesch |
| 2007/0039225 A1 | 2/2007 | Kallio et al. |
| 2007/0240355 A1 | 10/2007 | Hsu |
| 2008/0020355 A1 | 1/2008 | Young |
| 2008/0060248 A1 | 3/2008 | Pine et al. |
| 2008/0156556 A1 | 7/2008 | Takahashi |
| 2015/0153138 A1 | 6/2015 | Presley et al. |

FOREIGN PATENT DOCUMENTS

| | | |
|---|---|---|
| WO | 9942783 A1 | 8/1999 |
| WO | 2014170862 A1 | 10/2014 |

OTHER PUBLICATIONS

Bowman, Pointing Devices, Apparatus, Systems and Methods for High Shock Environments, U.S. Appl. No. 14/577,179, filed Dec. 19, 2014, Office Action Summary dated Sep. 3, 2015, 8 pages.

* cited by examiner

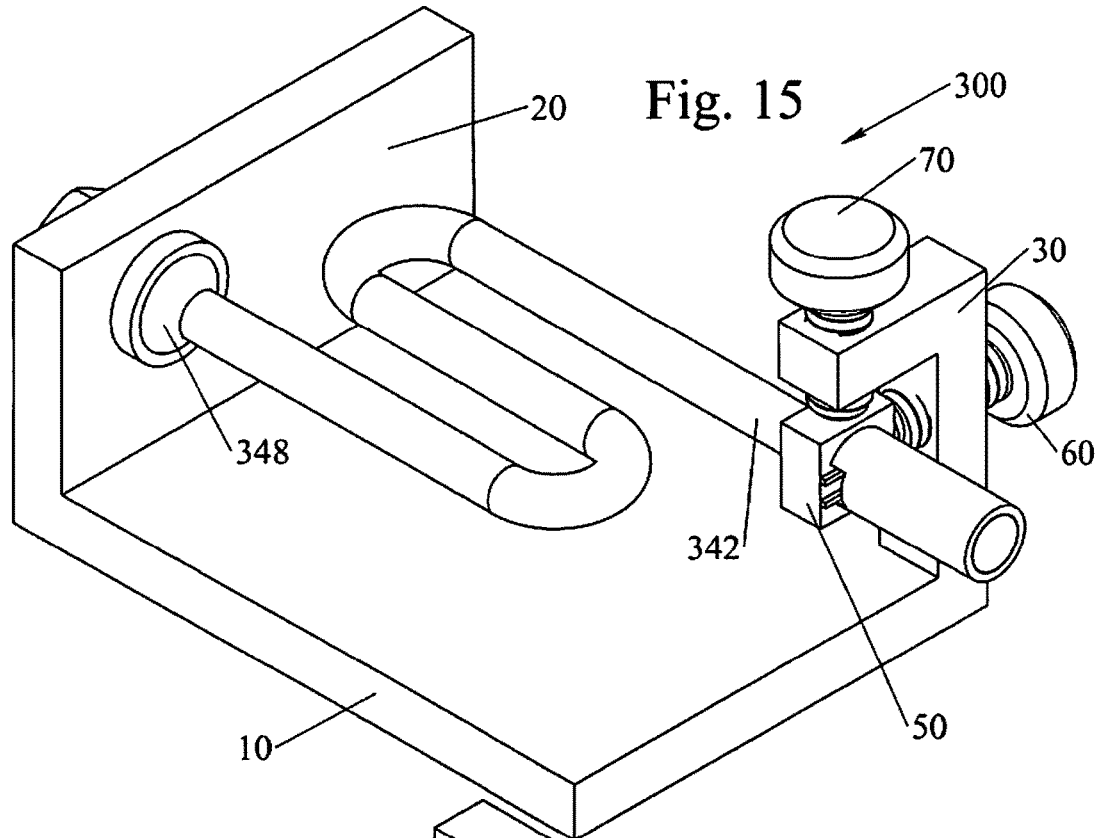
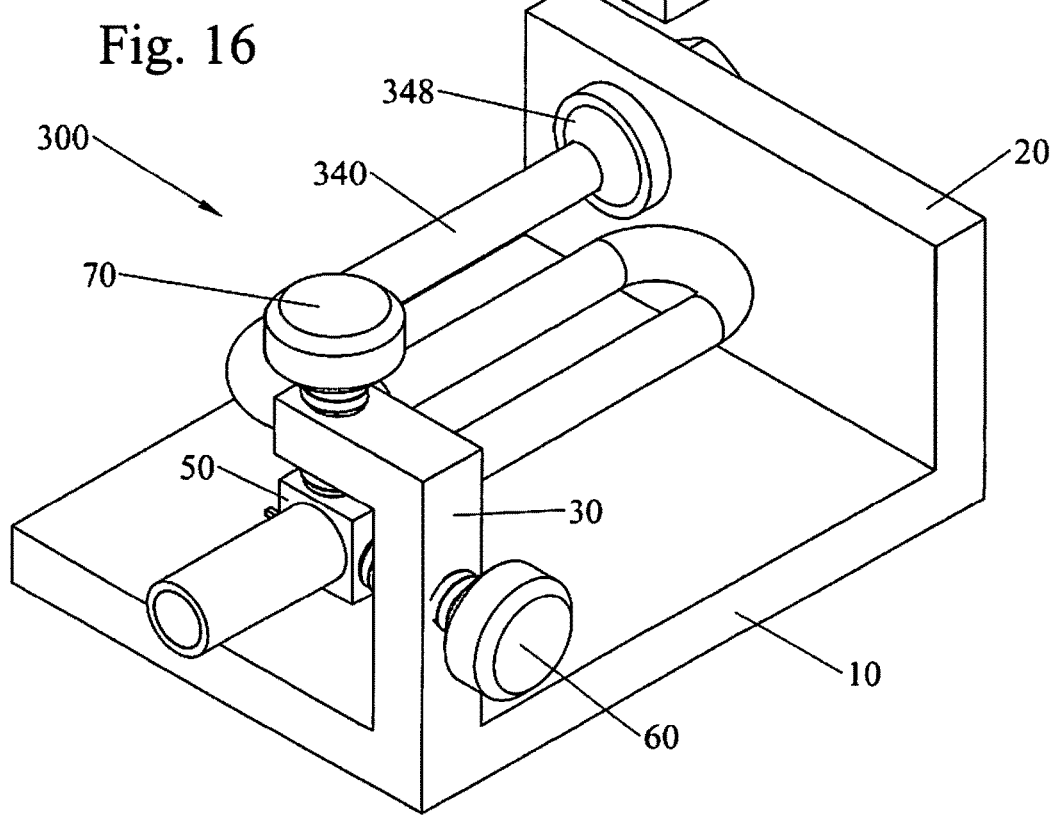

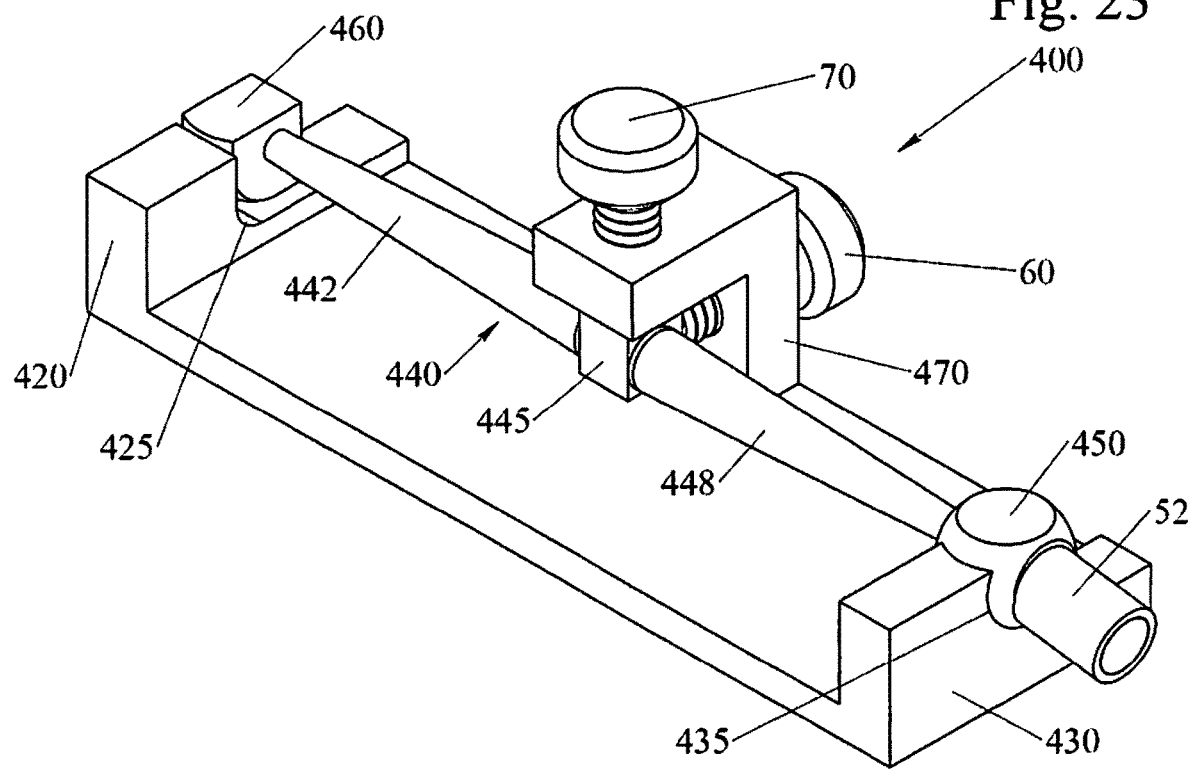
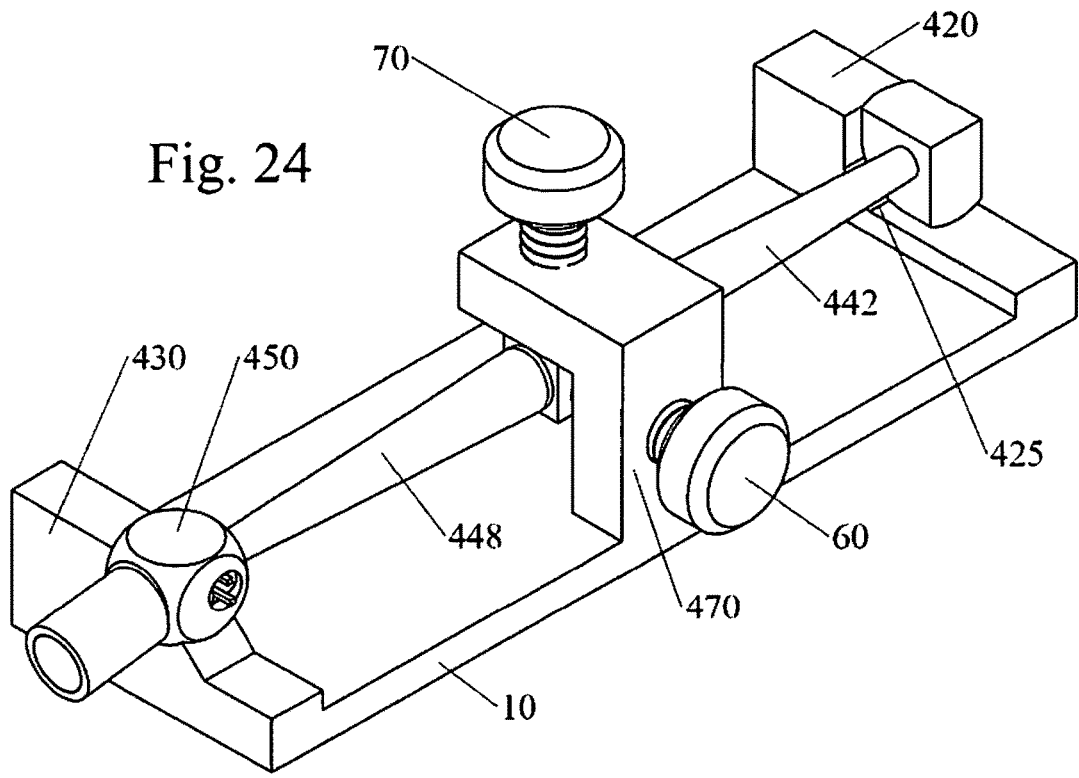

Fig. 27
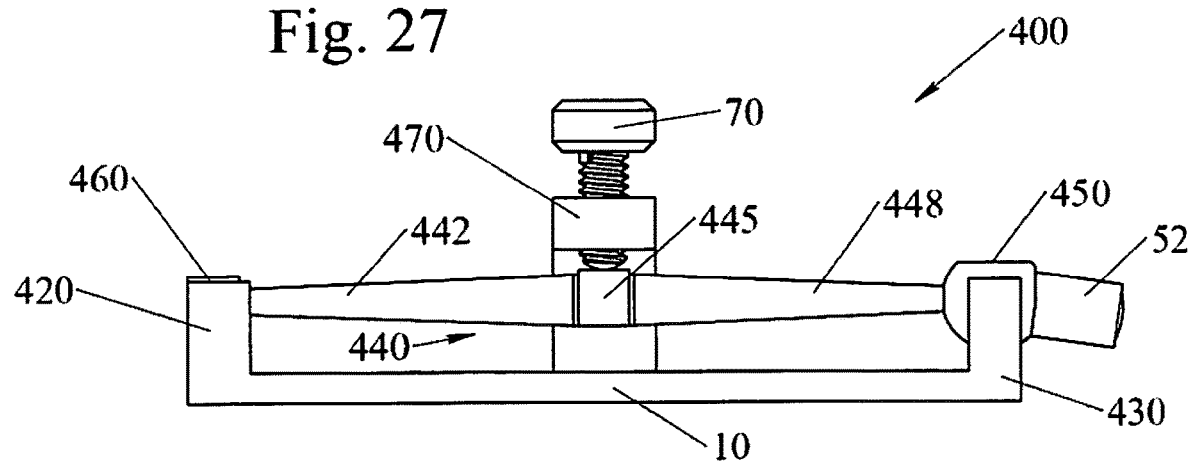
Fig. 28
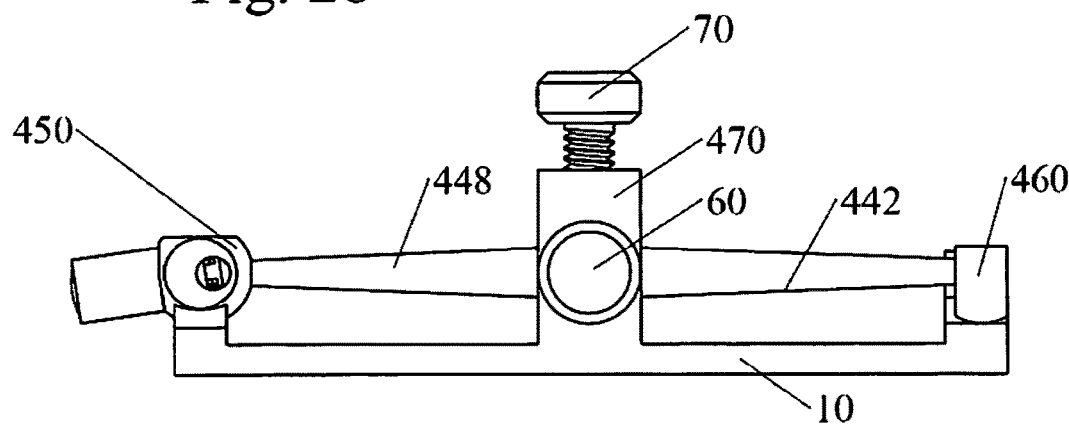
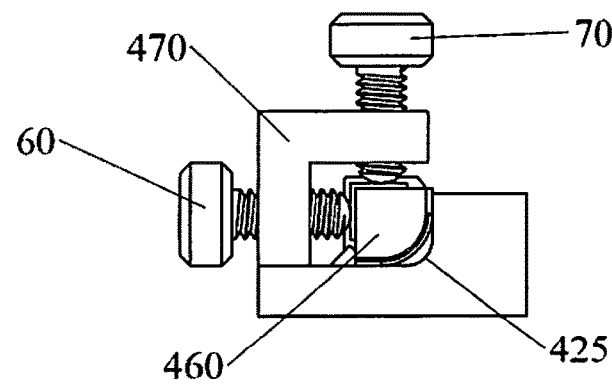
Fig. 29

Fig. 38
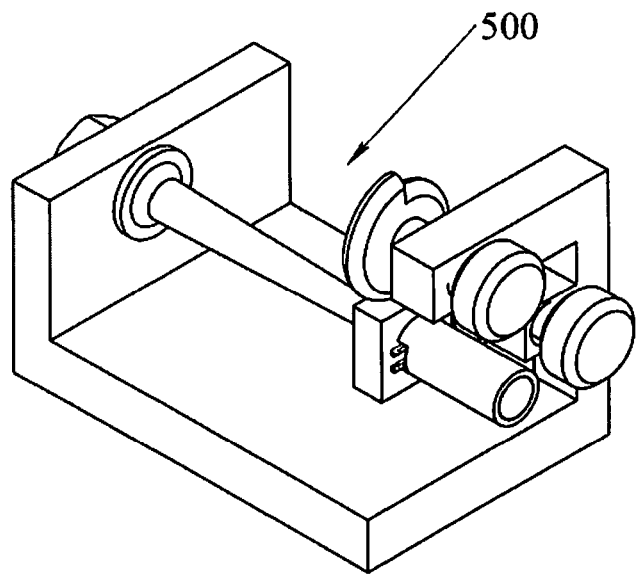
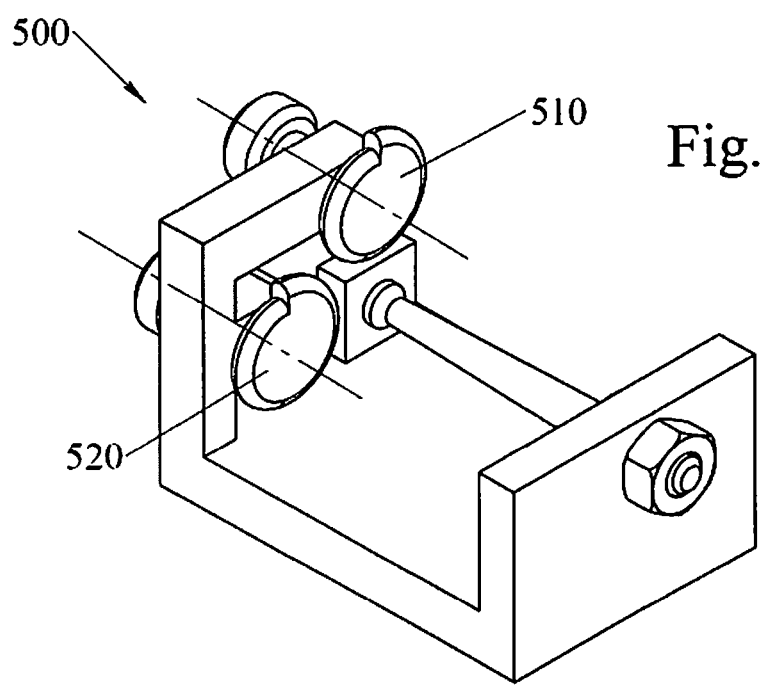
Fig. 39

Parabola – Parabolic Profile

Data Point Definition----None equation driven----Profile Defined by points

POINTING DEVICES, APPARATUS, SYSTEMS AND METHODS FOR HIGH SHOCK ENVIRONMENTS

CROSS REFERENCE TO RELATED APPLICATIONS

This application is a continuation application of U.S. patent application Ser. No. 16/444,302 filed Jun. 18, 2019 now U.S. Pat. No. 11,050,216 which is a divisional application of U.S. patent application Ser. No. 15/474,449 filed Mar. 30, 2017, now U.S. patent 10, 367, 331, which is a Divisional of U.S. patent application Ser. No. 14/577,179 filed Dec. 19, 2014, now U.S. Pat. No. 9,638,493, which is a continuation-in-part application of U.S. patent application Ser. No. 14/513,809 filed on Oct. 14, 2014, now U.S. Pat. No. 9,270,082, which is a divisional application of U.S. patent application Ser. No. 14/089,041 filed on Nov. 25, 2013, now U.S. Pat. No. 9,077,139, which is a divisional application of U.S. patent application Ser. No. 13/442,425 filed on Apr. 9, 2012, now U.S. Pat. No. 8,826,582 issued on Sep. 9, 2014, which claims the benefit of priority to U.S. Provisional Application 61/629,737 filed Nov. 26, 2011. The entire disclosure of each of the applications listed in this paragraph are incorporated herein by specific reference thereto.

FIELD OF INVENTION

This invention relates to precision pointing, in particular to devices, apparatus, systems and methods for providing accurate linear and angular positioning of a payload, such as a laser pointer and maintains the initial precise pointing during and after exposure in high G shock and vibration environments, with the capability of adjusting minute changes in beam orientation, where the beam supporting the payload can be a mathematical equation based conical shaped beam or non-equation based beam profile. The precision adjustments can be performed in a zero G, one G, or high G environment and maintains the adjustment during and after being exposed to a high G shock or vibration environment.

BACKGROUND AND PRIOR ART

Laser pointing devices have been widely used on firearms to allow the shooter to accurately aim the weapon without using the weapons sights, and are used in military type training systems to simulate an aimed shot. They have also been used in many commercial products and as aids in testing products, also range finders, laser designators, and the like.

The most common firearm application is to mount a laser on a weapon, providing adjustment so the laser can be aligned with the sights and use the laser beam to point the weapon at a target while the trigger is being pulled. Once the shot is fired, the alignment of the laser relative to the sights does not come into play since the bullet is on its trajectory to the target. The patents also claim the mounting and adjustments isolates the laser from the weapons shock which means the laser assembly is designed to move relative to the weapon during the high G shock event from firing the weapon.

The Multiple Integrated Laser Engagement System (MILES) is a training system providing a realistic battlefield environment for soldiers involved in training exercises. The Army developed the original family of MILES devices in the late '70s and early '80s using state-of-the-art technology of that time. MILES is the primary training device for force-on-force training at Army home stations. A MILES system for a soldier includes a laser module (Small Arms Transmitter or SAT) mounted to the barrel of a real weapon, a blank firing adapter, and an integrated receiver with sensors on the helmet and load-bearing vests for the soldiers. The SAT's laser beam is aligned by the solder to the weapon's sights when the SAT is mounted to the weapon. During the training exercise, the soldier aims the weapon on the opposing force soldier using the weapon's standard sights. When a blank shot is fired by the weapon, it causes the laser to fire a coded laser burst in the direction the weapon was aimed. Information contained in the laser pulses includes the player ID and the type of weapon used. If that laser burst is sensed by the receiver of another soldier, the "hit" soldier's gear beacon makes a beeping noise to let them know they are "dead."

When the weapon fires a blank in the MILES system, unique shock, flash and acoustic signatures are generated. Two of these signatures are decoded to determine a valid event and initiate MILES code transmissions Once a validated event is detected, the transmitter fires 4 Hit Words and 128 Near-Miss Words. Each word is –4 milliseconds (msec) long, the duration for 132 words is 484 msec or 0.484 seconds. The laser beam foot print (typical angular foot print size is 1 mrad to 3 mard and the maximum size is limited by the specification) needs to illuminate the detector sensor for the full duration of a Hit or Near-Miss Word to be registered by the receiver software as a Kill or Near-Miss.

In the MILES system, there occurs a gross angular weapon movement after the blank has fired that moves the center of the laser foot print away from the sensor. During the time period from trigger pull to firing of the blank and firing the laser, the weapon moves in a semi-repeatable motion. See U.S. Published Patent Application 2004/0005531 for FIGS. 8, 9 & 10. For open bolt weapons like the M240 and M249, the movement and corresponding error is greater after the trigger pull due to the time required for the bolt to close and the impact of the bolt increases the gross angular weapon movement. The shock from the bolt closing and/or the blank firing causes the SAT housing and mounting components to flex and introduce an addition pointing error to the gross weapon movement error which is not repeatable. Also based on the internal construction, the adjustment mechanism can unload (bounce) during the high G event and introduce additional significant pointing errors which is not repeatable.

The sum of these angular pointing errors sources, (gross weapon movement, SAT component flexure and unloading) start at zero values for time zero (trigger pull) and increase over time. The SAT laser needs to be pointing at the opposing soldier's receiver and illuminating it for the 4 msec duration required to transmit the first hit word. The total angular pointing error movement has to less than half the laser angular footprint by the time the SAT has detected the event and finished transmitting the first hit word. The gross weapon angular pointing error is real and part of the normal system operation. The second and third error sources (flexure and unloading) are the problems. They are not part of the normal system operation and need to be minimized or cancelled. To the extent these are not reduced, the training system will depart from reflecting the actual accuracy of the soldier's performance, failing to register otherwise good hits.

The present SAT design approaches do not maintain the initial precise pointing during and after exposure in high G shock and vibration environments.

Various approaches have been proposed to deal with these types of problems. For example, U.S. Published Patent Application 2004/0005531 to Varshneya et al. describes an elaborate and complex system for calibrating misalignment of a weapon-mounted zeroed small arms transmitter (ZSAT) laser beam axis with the shooter line-of-sight (LOS) in a weapon training system, but fails to easily solve the problem. The proposed solution only addresses the repeatable error produced by the dynamic muzzle displacement from the gross weapon movement not the unrepeatable errors from the flexure and unloading errors.

Other types of devices have resulted in additional problems. See for example, U.S. Pat. No. 2,189,766 to Unerti; U.S. Pat. No. 3,476,349 to Smith; U.S. Pat. No. 3,596,863 to Kaspareck; U.S. Pat. No. 4,079,534 to Snyder; U.S. Pat. No. 4,161,076 to Snyder; U.S. Pat. No. 4,212,109 to Snyder; U.S. Pat. No. 4,295,289 to Snyder; U.S. Pat. No. 4,313,272 to Matthews; U.S. Pat. No. 4,686,440 to Nagasawa; U.S. Pat. No. 4,738,044 to Osterhout; U.S. Pat. No. 4,876,816 to Triplett; U.S. Pat. No. 4,916,713 to Gerber; U.S. Pat. No. 4,958,794 to Brewer; U.S. Pat. No. 5,033,219 to Johnson; U.S. Pat. No. 5,299,375 to Heinz; U.S. Pat. No. 6,378,237 to Matthews; U.S. Pat. No. 6,714,564 to Meyers; U.S. Pat. No. 6,793,494 to Deepak; U.S. Pat. No. 6,887,079 to Robertsson; U.S. Pat. No. 7,014,369 to Alcock; U.S. Pat. No. 7,331,137 to Hsu; U.S. Pat. No. 7,418,894 to Ushiwata; U.S. Pat. No. 7,558,168 to Chen; U.S. Pat. No. 7,726,061 to Thummel; U.S. Pat. No. 7,753,549 to Solinsky; U.S. Pat. No. 7,886,644 to Ushiwata; U.S. Pat. No. 7,922,491 to Jones; U.S. Pat. No. 7,926,218 to Matthews; and U.S. Published Patent Applications: 2001/0000130 to Aoki; 2003/0204959 to Hall; 2004/0161197 to Pelletier; 2006/0156556 to Nesch; and 2007/0240355 to Hsu.

Some of the proposed devices intentionally shock isolate by allowing movement of the laser beam axis relative to the weapon to prevent damage to the laser or associated electronics and therefore does not maintain alignment during the shock.

Other proposed devices include multiple parts that move relative to each other when the devices are aligned or boresighted. Due to manufacturing tolerances, there are clearances between mating surfaces that slide relative or mate to each other. There is friction at the sliding and spherical joints due to the preload forces. The tangential friction forces at the contacting surfaces produce bending in the components. During the high G shock or vibration event, the friction at the interface surfaces will go to zero and allow the components to slide and rotate to a force free state. This movement will produce a pointing error relative to the initial alignment. The larger the quality of interfaces, the larger the total pointing error after a shock.

Additional problems with the prior art have included devices having sliding or pivoting joints and geared interfaces that have clearance between the none contacting surfaces can become contaminated which will cause binding or increased friction which will increase the pointing angle error.

Prior art devices have included plural components, threaded rods that translate wedges used for alignment, due to clearances between the mating threaded parts, when the direction and adjustment is reversed, hysteresis will be introduced which is a source of error. After adjustment, during the shock, the stiction will be relieved and the wedge can move over the range of the thread clearance producing a pointing error.

Some of the prior art devices include large and heavy components for a 1 G or manufacturing environment where there is no shock or vibration environment and there is no limitation on size, weight or adjustment type and are cumbersome for field use, difficult to adjust in the field, or the alignment is set at the factory.

Some of the prior art includes devices which cannot maintain alignment or boresight over the wide temperature operating range from the low −40° C. to the high temperature where the barrel of the M240 can exceed 350° C. Over this temperature range, any mismatch in the components CTE (coefficient of thermal expansion) will cause binding or increased clearances at the interfaces which will increase the pointing errors. The component's CTE mismatch will also introduce a bimetallic error as the temperature changes from the initial adjustment temperature.

Still other prior art devices use different types of springs to preload the system against the adjustment stops so a payload does not move away from the stop and produce a dynamic pointing error. The springs used cannot produce enough force in the limited volume to counteract the unloading force.

Thus, the need exists for solutions to the above problems with the prior art.

SUMMARY OF THE INVENTION

A primary objective of the present invention is for providing compact devices, apparatus, systems and methods for maintaining accurate linear and angular positioning of a conical shaped cantilevered beam or S shaped cantilevered beam or center deflecting beam with free ends, with each beam with one of an equation drive beam profile or a non-equation based beam profile having one end with mounted payload, during and after exposure in high G shock and vibration environments, with the capability of adjusting minute changes in beam orientation.

A secondary objective of the present invention is for providing compact devices, apparatus, systems and methods for maintaining accurate linear and angular positioning of a conical shaped cantilevered beam or S shaped cantilevered beam or center deflecting beam with free ends, with each beam having one end with mounted payload, during and after exposure in high G shock and vibration environments, with the capability of adjusting minute changes in beam orientation.

A third objective of the present invention is for providing compact devices, apparatus, systems and methods which maintains the initial precise pointing during and after exposure in high G shock and vibration environments, and does not require joints which have errors.

A fourth objective of the present invention is for providing compact devices, apparatus, systems and methods which maintains the initial precise pointing during and after exposure in high G shock and vibration environments, that does not have any static friction (stiction) introduced deflections where the tangential friction forces at the contacting surfaces cause bending deflections of the mechanism's components when boresighted.

A fifth objective of the present invention is for providing compact devices, apparatus, systems and methods which maintains the initial precise pointing during and after exposure in high G shock and vibration environments, which does not allow contamination to occurs between any bearing or mating surfaces.

A sixth objective of the present invention is for providing compact devices, apparatus, systems and methods which maintains the initial precise pointing during and after exposure in high G shock and vibration environments, having a single element with no hysteresis, a non-reversing adjustment load and is kinematically stable.

A seventh objective of the present invention is for providing compact devices, apparatus, systems and methods which maintains the initial precise pointing during and after exposure in high G shock and vibration environments, which is small, and light weight-by combining functions where the mass is reduced and the restraining force required and the associated mass is also reduced.

An eighth objective of the present invention is for providing compact devices, apparatus, systems and methods which maintains the initial precise pointing during and after exposure in high G shock and vibration environments, that does not show any pointing error over a wide temperature range, from −40° C. to approximately 350° C., and more.

A ninth objective of the present invention is for providing compact devices, apparatus, systems and methods which maintains the initial precise pointing during and after exposure in high G shock and vibration environments that is immune from binding at the joints and pointing errors due to any CTE mismatch of the components.

A tenth objective of the present invention is for providing compact devices, apparatus, systems and methods which maintains the initial precise pointing during and after exposure in high G shock and vibration environments, having an adjustment point location that can cancel/reduce the dynamic pointing error introduced by the beams first and second modes of vibrations which are the major contributors to the dynamic pointing errors.

A preferred embodiment of the precision pointing mechanism can include five major components or assemblies. The first component is the base which supports the other components. The second component is the payload which is being positioned and/or pointed. The third component is the conical element that connects to the base and provides linear and/or angular flexure between the payload and the base. The conical element also provides preload force against the adjustment element(s) which are the fourth and fifth components. The fourth and fifth components are the adjustment element(s) that provide displacement of the payload end of the conical element relative to the base. The conical element performs multiple functions; is the structural member attaches the payload to the base, provides the kinematic rotation and linear displacement of the payload and the preload force so the payload does not unload (move away) from the adjustment points during the high G event.

The novel configuration for precision pointing of payloads can include multiple parts that move relative to each other. Given the manufacturing tolerances, there are no clearances between the mating surfaces that can introduce pointing errors after the initial adjustment and allows movement during the high G shock and vibration events that can produce a dynamic pointing error and does not maintain the initial adjustment. Also, stiction between the components can introduce static and dynamic pointing errors. There is no stiction between the components that will be removed during the dynamic environment and allow the components to move relative to each other and produce a static and or dynamic pointing error.

Further objects and advantages of this invention will be apparent from the following detailed description of the presently preferred embodiments which are illustrated schematically in the accompanying drawings.

BRIEF DESCRIPTION OF THE FIGURES

FIG. 15 is an upper front left perspective view of another single laser system with an S shaped cantilevered beam supporting the laser.

FIG. 16 is an upper front right perspective view of the another single laser system with an S shaped cantilevered beam supporting the laser of FIG. 15.

FIG. 23 is an upper front right perspective view of another single laser system with a center deflecting beam supporting the laser.

FIG. 24 is an upper front left perspective view of the center deflecting beam supporting the laser of FIG. 23.

FIG. 27 is a left side view of the center deflecting beam supporting the laser of FIG. 23.

FIG. 28 is a right side view of the center deflecting beam supporting the laser of FIG. 23.

FIG. 29 is a rear view of the center deflecting beam supporting the laser of FIG. 23.

FIG. 38 is a perspective view of a cam version of the invention.

FIG. 39 is another perspective view of the cam version of FIG. 38.

FIG. 40b is a side profile of the cylindrical beam shown in FIG. 40a.

FIG. 41b is a side view of the non-straight cylindrical shaped beam shown in FIG. 41a.

DESCRIPTION OF THE PREFERRED EMBODIMENTS

Before explaining the disclosed embodiments of the present invention in detail it is to be understood that the invention is not limited in its applications to the details of the particular arrangements shown since the invention is capable of other embodiments. Also, the terminology used herein is for the purpose of description and not of limitation.

A listing of components will now be described.

| | |
|---|---|
| 1. | laser system with conical cantilevered beam |
| 10. | base of housing |
| 20. | rear wall of housing |
| 25. | threaded opening for battery |
| 30. | support housing portions for adjustment controls |
| 32. | front top of housing |
| 33. | cover of housing |
| 34. | front side of housing |
| 38. | front wall of housing |
| 39. | cover mounting screws/washer |
| 40. | cantilevered conical beam |
| 42. | base wide end |
| 43. | fastener (nut) |
| 48. | narrow tip end |
| 50. | payload |
| 52. | laser housing |
| 53. | laser diode |
| 56. | lens |
| 60. | lateral adjustment control |
| 61. | o-ring for lateral adjustment |
| 70. | vertical adjustment control |
| 71. | o-ring for vertical adjustment |
| 80. | battery |
| 85. | battery cover |
| 87. | connector |
| 90. | Circuit Card Assembly |
| 92. | event sensor #1 |
| 94. | event sensor #2 |
| 96. | antenna cover |
| 98. | on/off switch |
| 100. | Firearm mounted application |
| 110. | upper clamp |
| 120. | pivotal clamp |
| 123. | hinge pin |
| 125. | screw/washer |
| 190 | weapon |
| 200. | dual laser or laser and detector system |
| 220. | dual laser or laser and detector payload |
| 250. | single mirror system |
| 270. | single mirror payload |
| 300. | laser system with S shaped cantilevered beam |
| 340. | S shaped cantilevered beam |
| 342. | tip end of cantilevered beam |
| 348. | rear mounted end of S shaped cantilevered beam |
| 400. | laser system with center deflecting beam |
| 420. | rear wall of housing |
| 425. | opening in rear wall with opening having curved interior surface portion(s) |
| 430. | front wall of housing |
| 435. | opening in front wall with opening curved interior surface |
| 440. | center deflecting beam |
| 442. | rear conical portion of center deflecting beam |
| 445. | middle portion of center deflecting beam |
| 448. | front conical portion of center deflecting beam |
| 450 | payload(laser) support housing on front end of center deflecting beam |
| 460. | rear mount support on rear end of center deflecting beam |
| 470. | C shaped housing support for vertical and lateral controls |
| 500. | Cam embodiment |
| 510. | Cam wheel |
| 520. | Cam wheel |

Conical Shaped Cantilevered Beam

Figure 1:
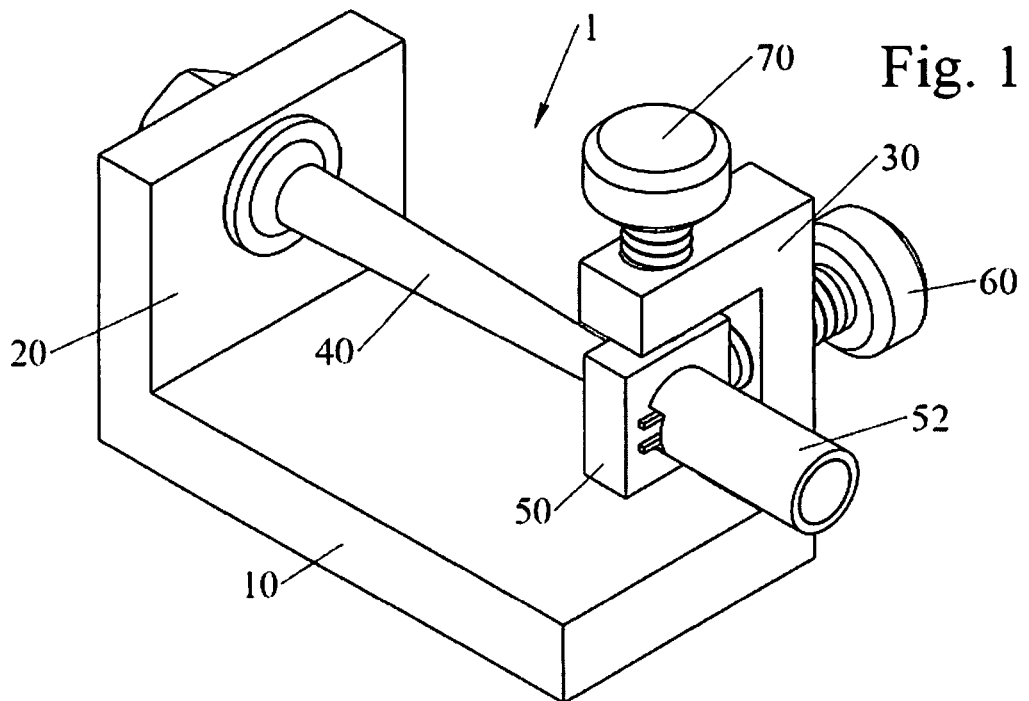
FIG. 1 is a perspective upper left front view of a single laser system with conical cantilevered beam supporting a laser.
Figure 2:
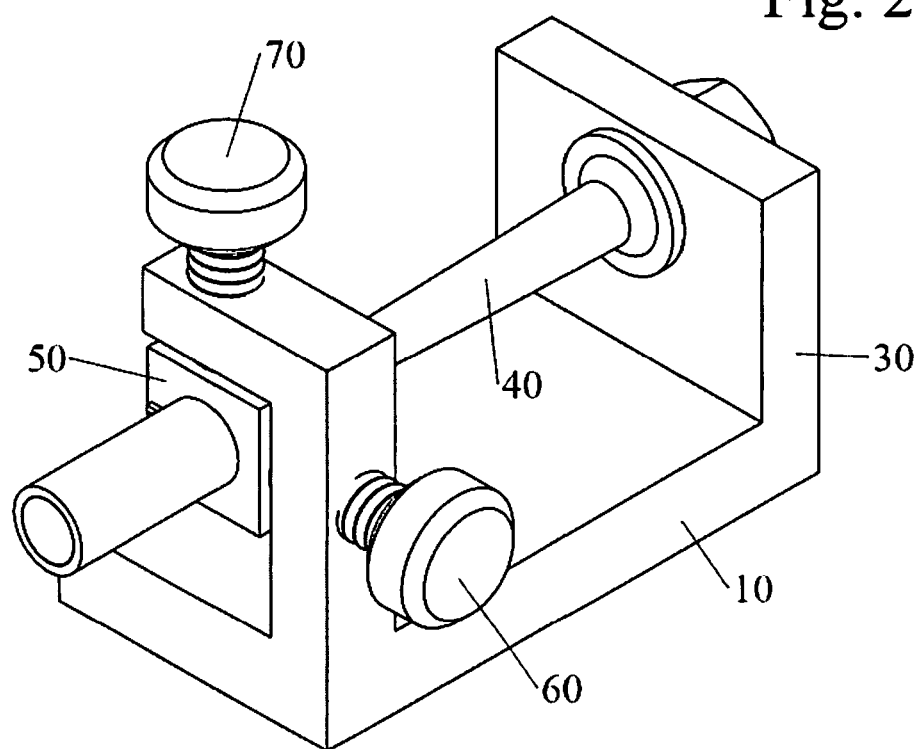
FIG. 2 is a perspective upper right front view of the laser system of FIG. 1.
Figure 4:
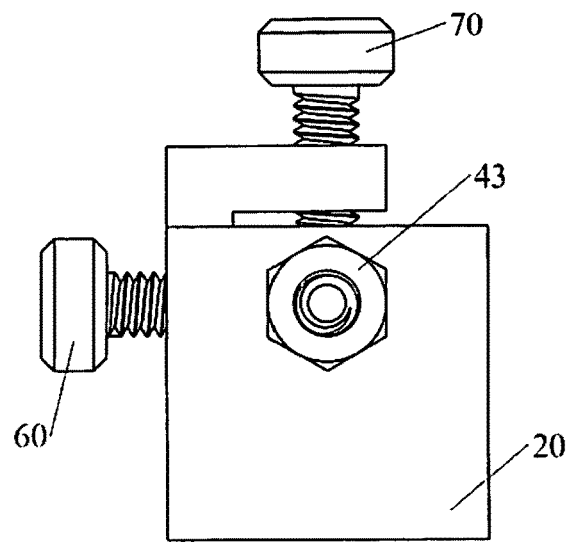
FIG. 4 is a rear view of the laser system of FIG. 1.
Figure 3:
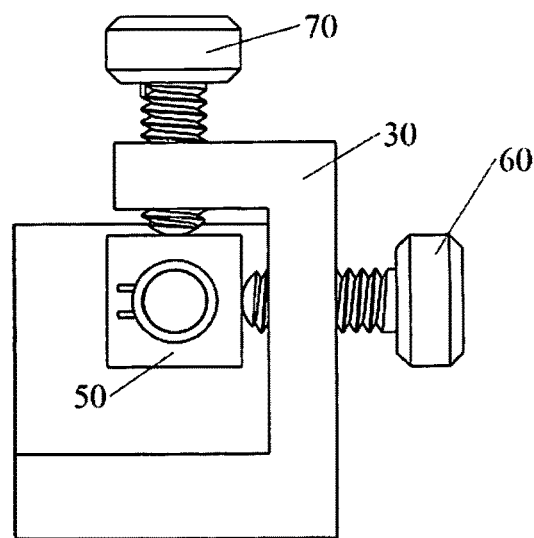
FIG. 3 is a front view of the laser system of FIG. 1.
Figure 5:
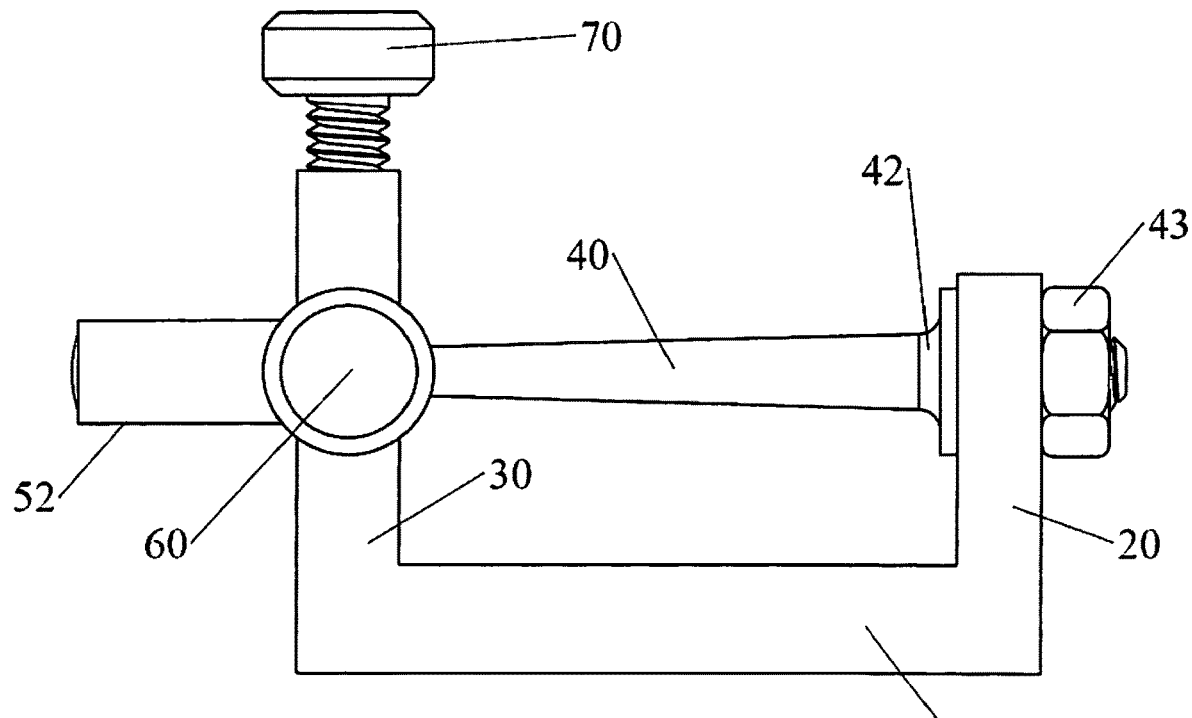
FIG. 5 is a right side view of the laser system of FIG. 1.
Figure 6:
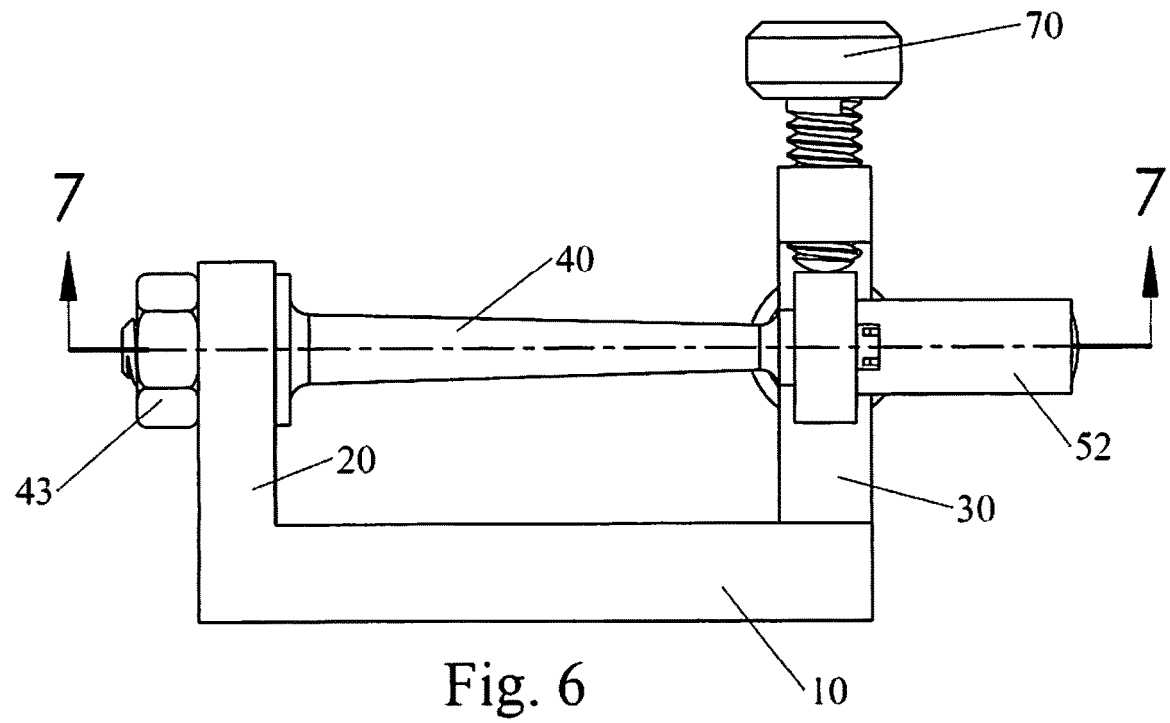
FIG. 6 is a left side view of the laser system of FIG. 1.
Figure 7:
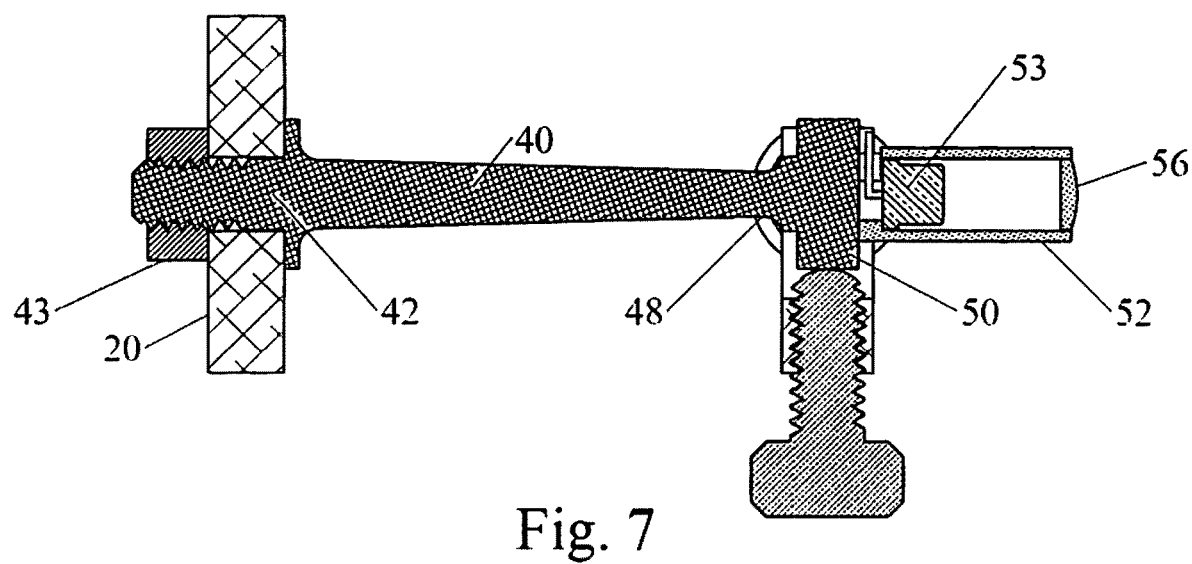
FIG. 7 is a cross-sectional view of the laser system of FIG. 6 along arrow 7B
Figure 8:
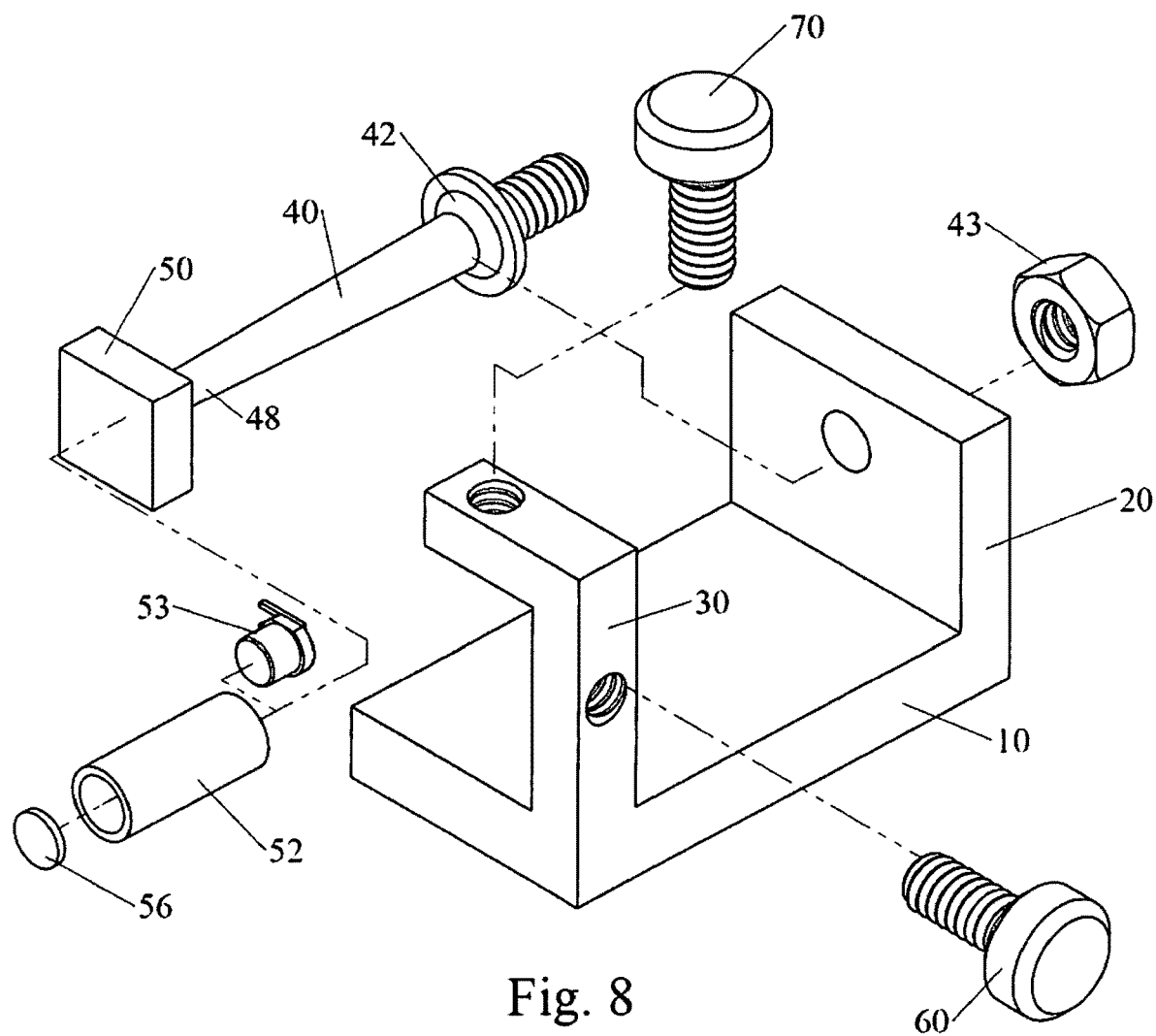
FIG. 8 is an exploded view of the laser system of FIG. 1.

FIG. 1 is a perspective upper left front view of a single laser system 1. FIG. 2 is a perspective upper right front view of the laser system 1 of FIG. 1. FIG. 3 is a front view of the laser system 1 of FIG. 1. FIG. 4 is a rear view of the laser system 1 of FIG. 1. FIG. 5 is a right side view of the laser system 1 of FIG. 1. FIG. 6 is a left side view of the laser system 1 of FIG. 1. FIG. 7 is a cross-sectional view of the laser system 1 of FIG. 6 along arrow 7B. FIG. 8 is an exploded view of the laser system 1 of FIG. 1.

Referring to FIGS. 1-8, the laser system can include basic components of an outer one-piece type housing to support the main components. The main components can include base 10, with a rear solid wall 20, and a support housing portions 30 for adjustment controls 60, 70, where the support portions can have an inverted C shaped configuration. A cantilevered conical beam 40 can have a wide base end 42 that can be mounted in the rear wall 20 by a fastener (nut) 43 at attaches about threaded ends of the wide base end 42. Other types of mounting techniques can also be used The conical shaped beam can be hollow or solid. A narrow tip end 48 of the cantilevered beam 40 can pass through the middle of the C shaped support portions 30 and the narrow tip end 48 can be mounted to a payload 50 that can include a laser housing 52 with laser diode 53 and lens 56.

Figure 40A:
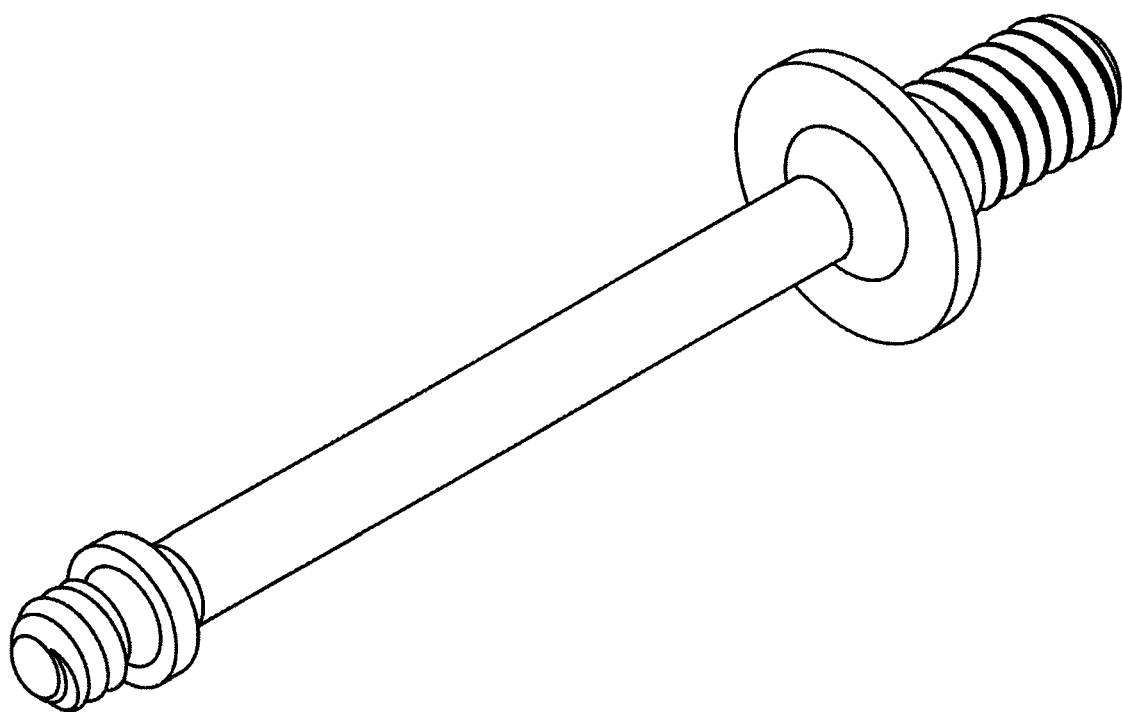
FIG. 40a is a perspective view of the cylindrical shaped beam.

The profile of the conical element's effective length can be a straight cylinder as shown in FIG. 40a, but the conical or curved shape provides lower weight and reduced dynamic pointing error. The taper adds to the capacity of the conical element by increasing the area moment of inertia where the moments and stresses are largest at the fixed end and allows material to be removed at the simply support end where the moments and stresses are minimal. The taper also provides a more constant curvature of the conical elements' centerline for a given deflection at the simply supported end.

Eccentricity is a parameter associated with conic sections like circle, ellipse, hyperbola etc. It is a measure of how much a conic section varies from being a circle. Below is the table for the eccentricity of the different conic sections:

| Conic section | eccentricity (e) |
| --- | --- |
| Ellipse | $0 < e < 1$ |
| Circle | $e = 0$ |
| Parabola | $e = 1$ |
| Hyperbola | $e > 1$ |
| Line | $e = \infty$ |

Figure 40B:
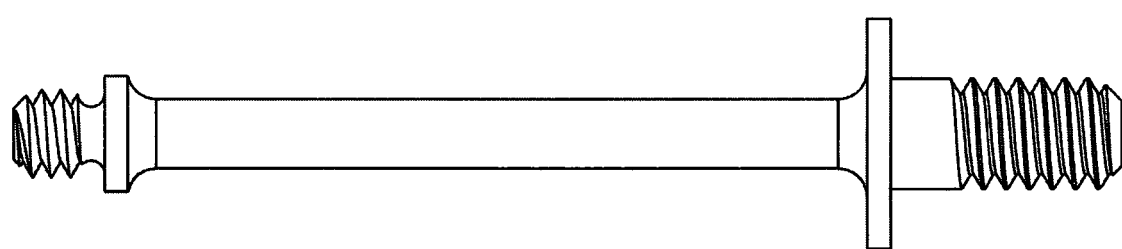
Figure 41A:
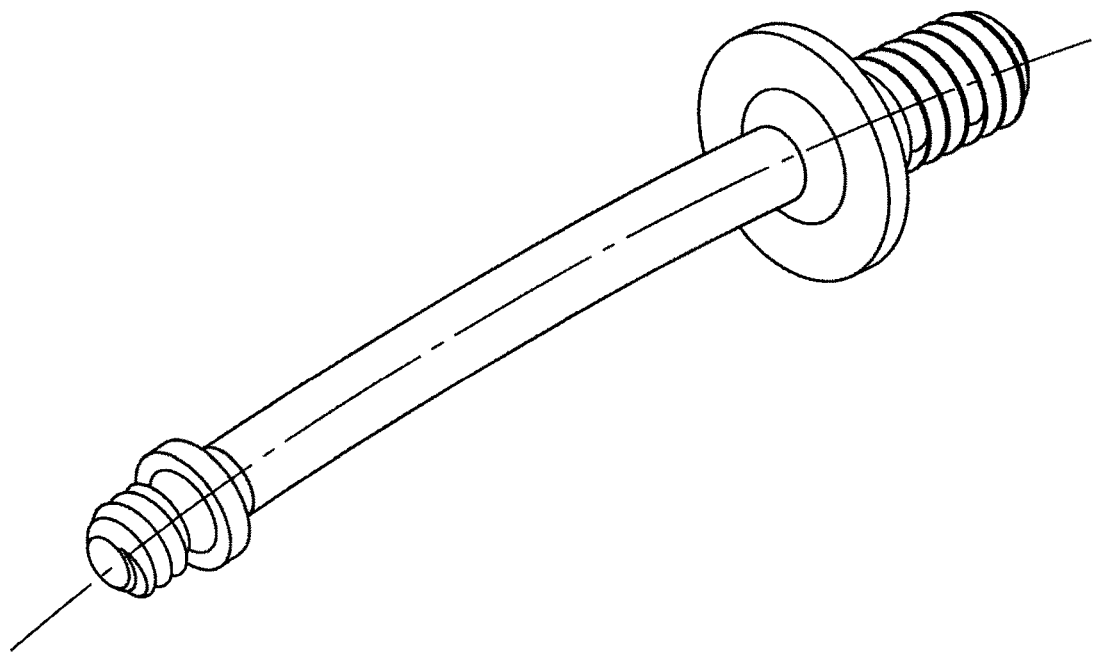
FIG. 41a is a perspective view of a non-straight cylindrical shaped beam.
Figure 41B:
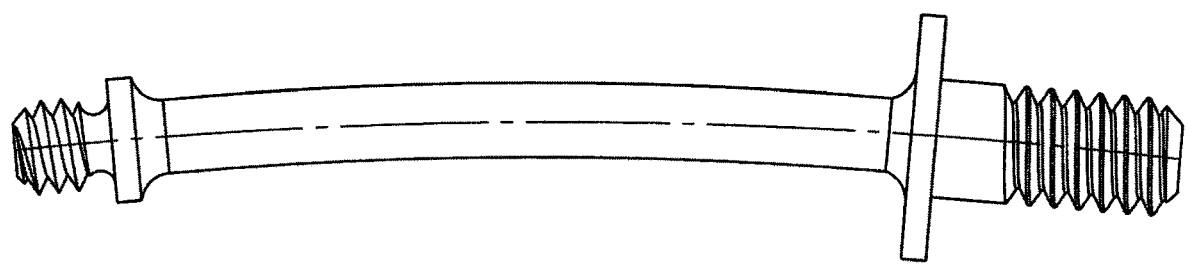

FIG. 40a is a perspective view of a conical beam with a cylindrical profile. As shown in the above table, the profile of the conic beam can vary, for example, the conic beam having an eccentricity of zero has a cylindrical conic profile as shown in FIG. 40b. The cylindrical profile beam can be solid or can be hollow to reduce the weight of the cylindrical beam. FIG. 41a is a perspective view of a non-straight cylindrical shaped beam prior to being displaced by the lateral and vertical adjustment controls and FIG. 41b is a side view of the non-straight cylindrical beam. The non-straight cylindrical profile beam can be solid or can be hollow to reduce the weight of the cylindrical beam.

Figure 42A:
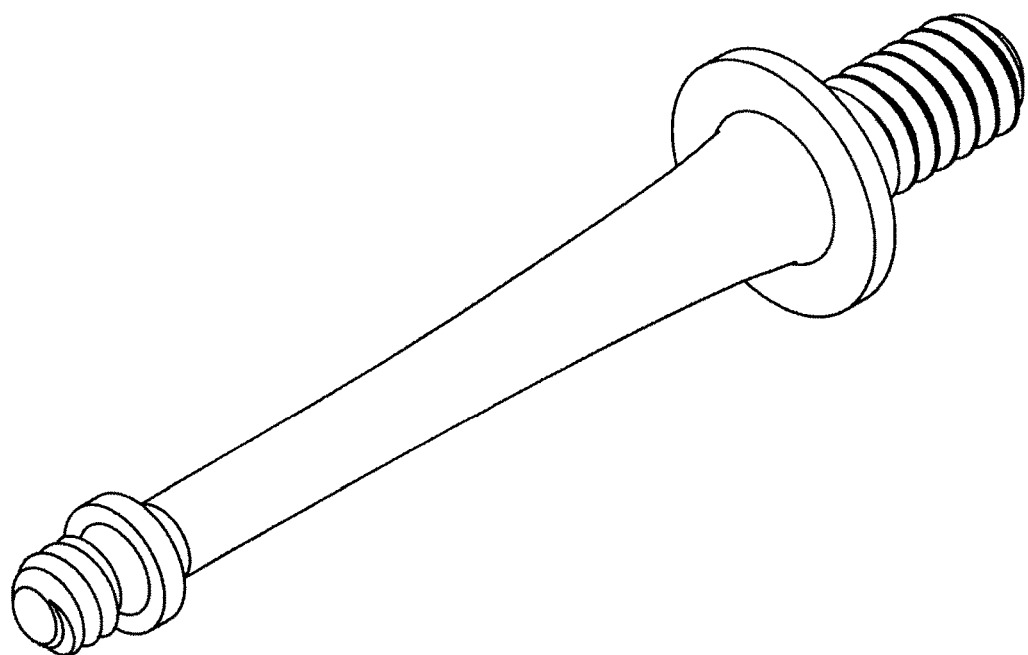
FIG. 42a is a perspective view of another example of a non-straight shaped beam.
Figure 42B:
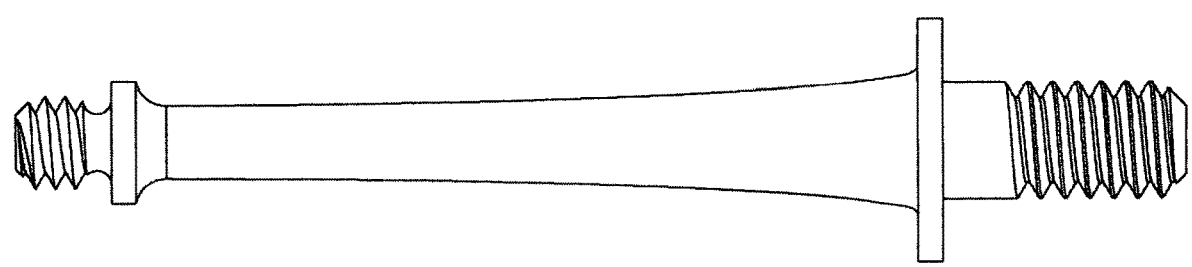
FIG. 42b is a side profile of the non-straight beam shown in FIG. 42a with an elliptical profile.
Figure 43A:
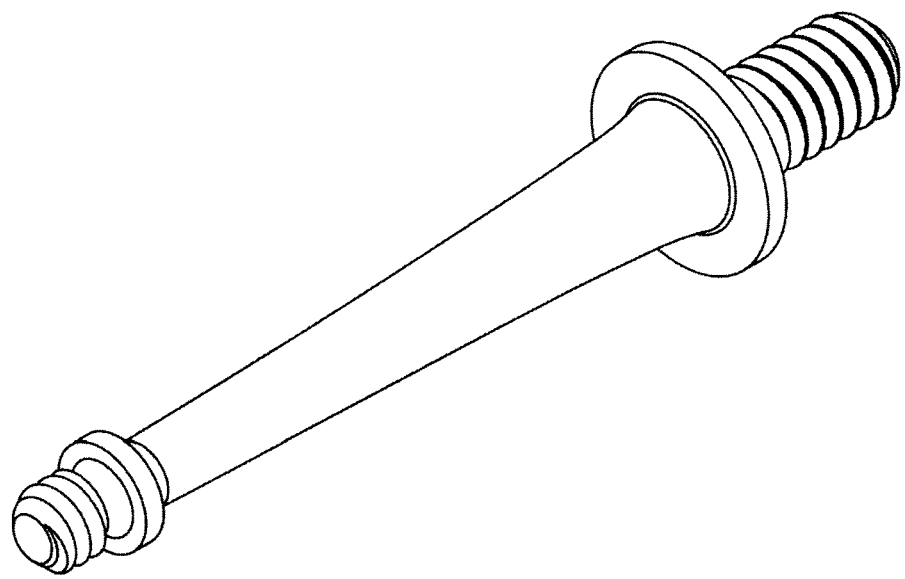
FIG. 43a is a perspective view of another non-straight shaped beam with a parabolic profile.
Figure 43B:
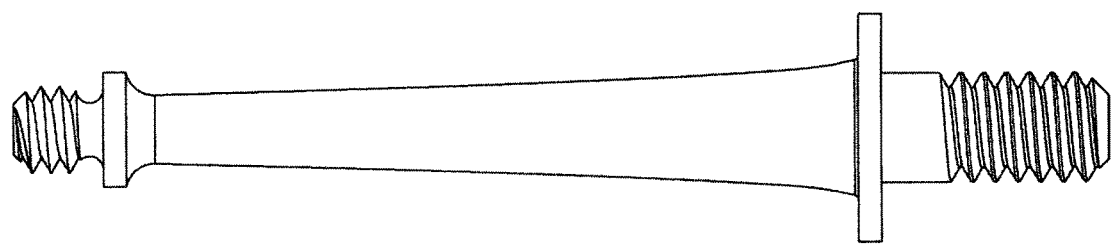
FIG. 43b is a side profile of the non-straight beam with a parabolic profile.
Figure 44A:
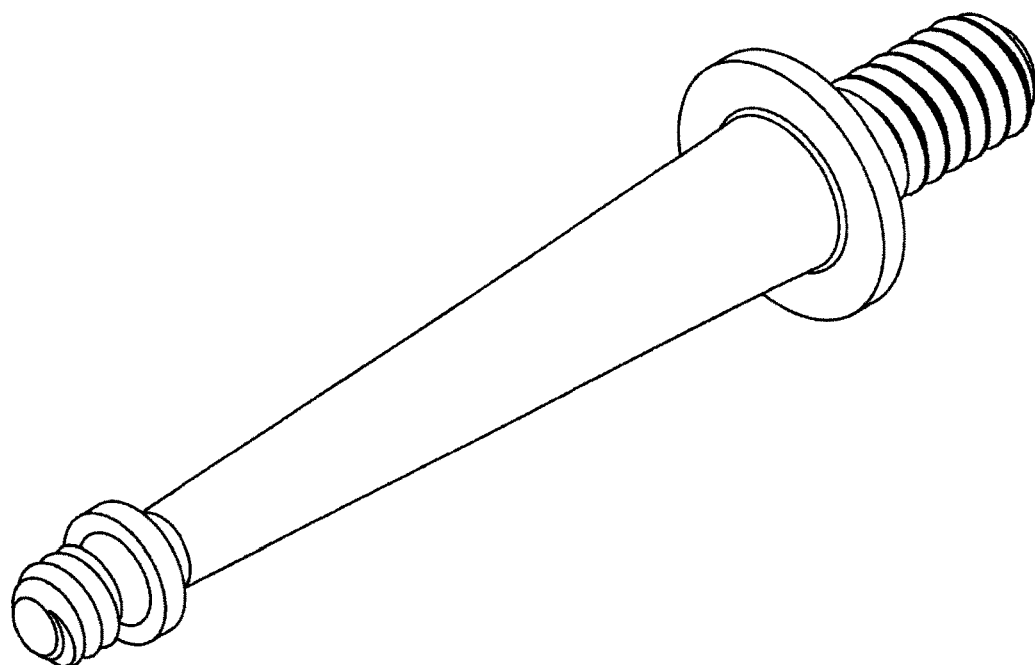
FIG. 44a is a perspective view of another non-straight shaped beam with a hyperbolic profile.
Figure 44B:
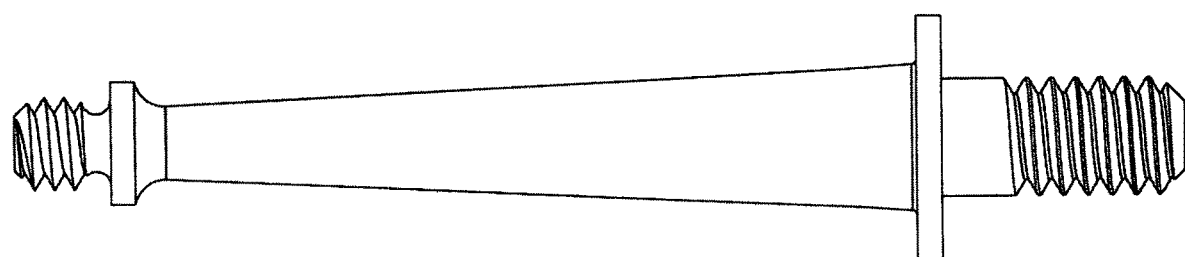
FIG. 44b is a side profile of the non-straight beam with a hyperbolic profile.
Figure 45A:
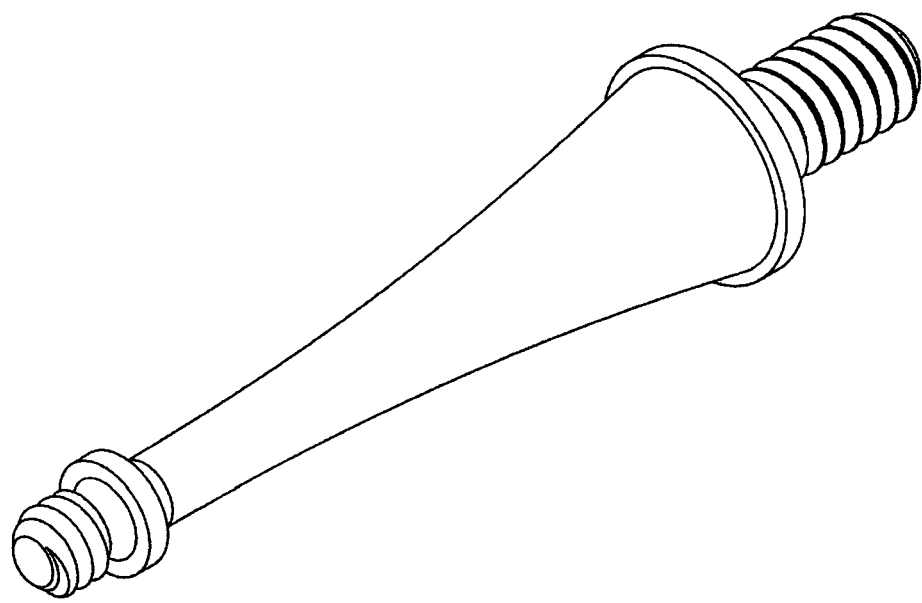
FIG. 45a is a perspective view of another non-straight shaped beam with a catenary profile.
Figure 45B:
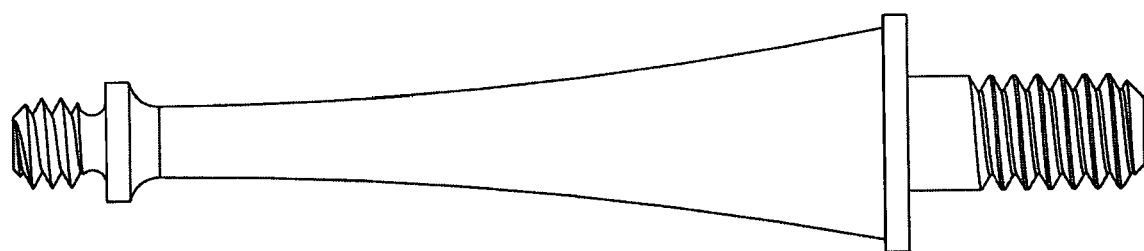
FIG. 45b is a side profile of the non-straight beam with a catenary profile.
Figure 46A:
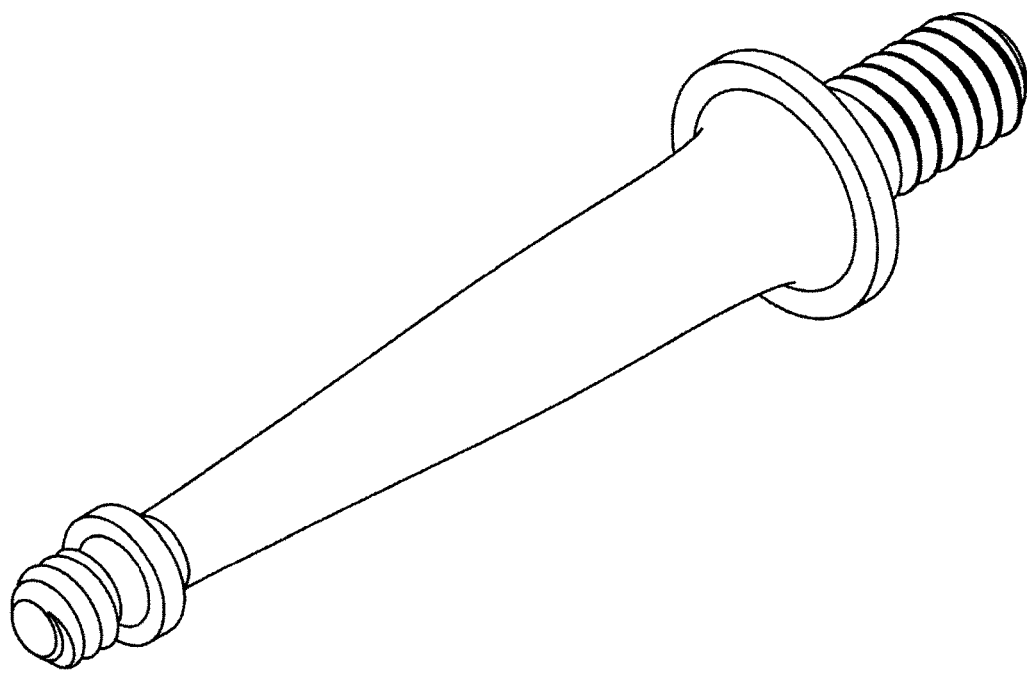
FIG. 46a is a perspective view of another non-straight shaped beam with a non-equation based, non-straight profile.
Figure 46B:
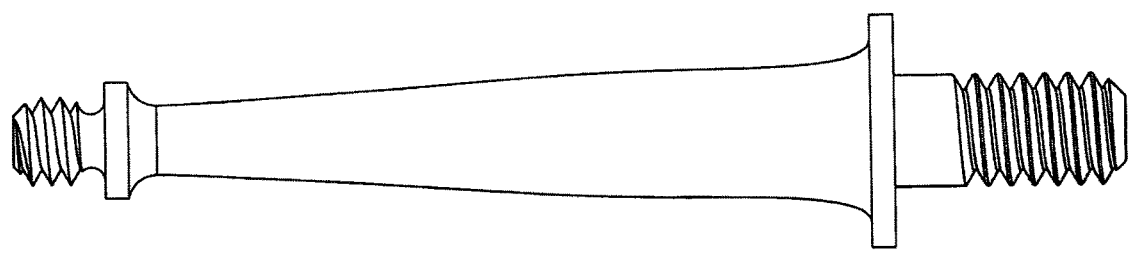
FIG. 46b is a side profile of the non-straight beam with a non-equation based, non-straight profile.
Figure 47A:
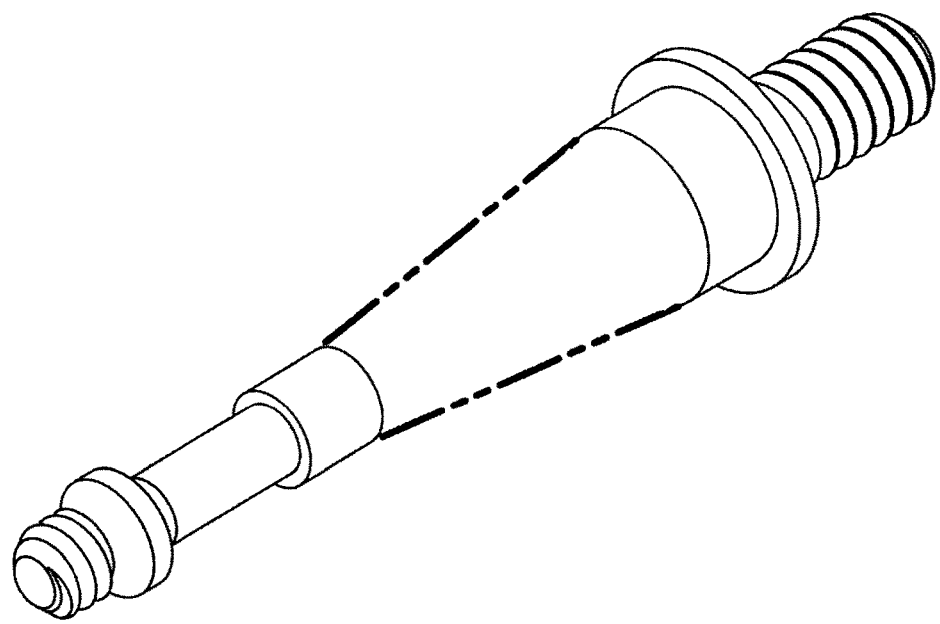
FIG. 47a is a perspective view of a multi-step based shaped beam.

Equation Driven Beam Profile:

Alternative non-straight beams are shown in FIGS. 42a and 42b (elliptical); FIGS. 43a and 43b ((parabolic); FIGS. 44a and 44b (hyperbolic); FIGS. 45a and 45b (caternary); FIGS. 46a and 47a (non-equation driven); and FIGS. 46a and 46b (stepped). The different beams can be equation driven or non-equation driven.

Ellipsed profile beams shown in FIGS. 42a and 42b are the closed type of conic section: a plane curve that results from the intersection of a cone by a plane. The cross section of a cylinder is an ellipse if it is sufficiently far from parallel to the axis of the cylinder. Ellipses have many similarities with the other two forms of conic sections: the parabolas and the hyperbolas, both of which are open and unbounded.

The beam with a parabolic profile shown in 43a and 43b is another example of an equation driven profile. In mathematics, parabolic cylindrical coordinates are a three-dimensional orthogonal coordinate system that results from projecting the two-dimensional parabolic coordinate system in the perpendicular z-direction. Hence, the coordinate surfaces are confocal parabolic cylinders.

The hyperbolic profile beam shown in FIGS. 44a and 44b is yet another example of an equation driven beam profile. In mathematics, hyperbolic functions are analogs of the ordinary trigonometric, or circular, functions. Hyperbolic functions occur in the solutions of some important linear differential equations, for example the equation defining a catenary, of some cubic equations, and of Laplace's equation in Cartesian coordinates. The catenary profile beam shown in FIGS. 45a and 45b is another example of an equation-driven beam profile.

Non-Equation Driven Beam Profile

The beam profile an also be non-equation-driven. For example, a non-equation driven, non-straight beam profile is shown in FIGS. 46a and 46b. As shown, the non-straight beam can have one or more areas of expansion or contraction, or both, of the beam between the two ends.

Figure 47B:
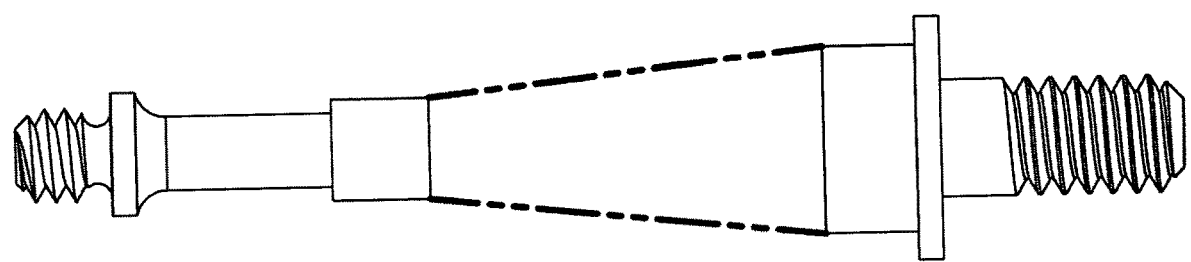
FIG. 47b is a side profile of the multi-step shaped beam showing an example of a multi-stepped profile.

Another example of a non-equation driven, non-straight beam is shown in FIGS. 47a and 47b. As shown, the beam can be configures with two or more different profile beams cascaded. The dashed lines are used to show alternate positions of parts, adjacent positions of related parts and repeated detail. The configuration shown is not intended to limit the example to a particular number of parts or placement of each different segment.

As described above, the profile of the conical beam can be equation drive, or non-equation driven, or any combination thereof. Likewise, each of the different conical configurations can be solid or hollow.

The conical element's spring constant and deflection shape (slope) vs. displacement distance by the adjustment elements in each axis can be tailored by the type of material (metal, plastic, composite), effective conical element length, cross section shape and conical element profile. The effective spring constant of the system can also be adjusted by the stiffness of the conical element's mounting surface geometry on the base and the mounting interface geometry on the payload housing.

The conical element's coefficient of thermal expansion (CTE) can be adjusted to match the effective CTE of the base and the structure the base is mounted to. Damping material can also be incorporated in the conical element design to dampen the movement and associated pointing error over time.

The position of the outer end 48 of the cantilevered beam 40 can be adjustably positioned by both a lateral adjustment control 60 and vertical adjustment control 70. The adjustment controls can be rotatable knobs, screws, and the like.

Figure 9:
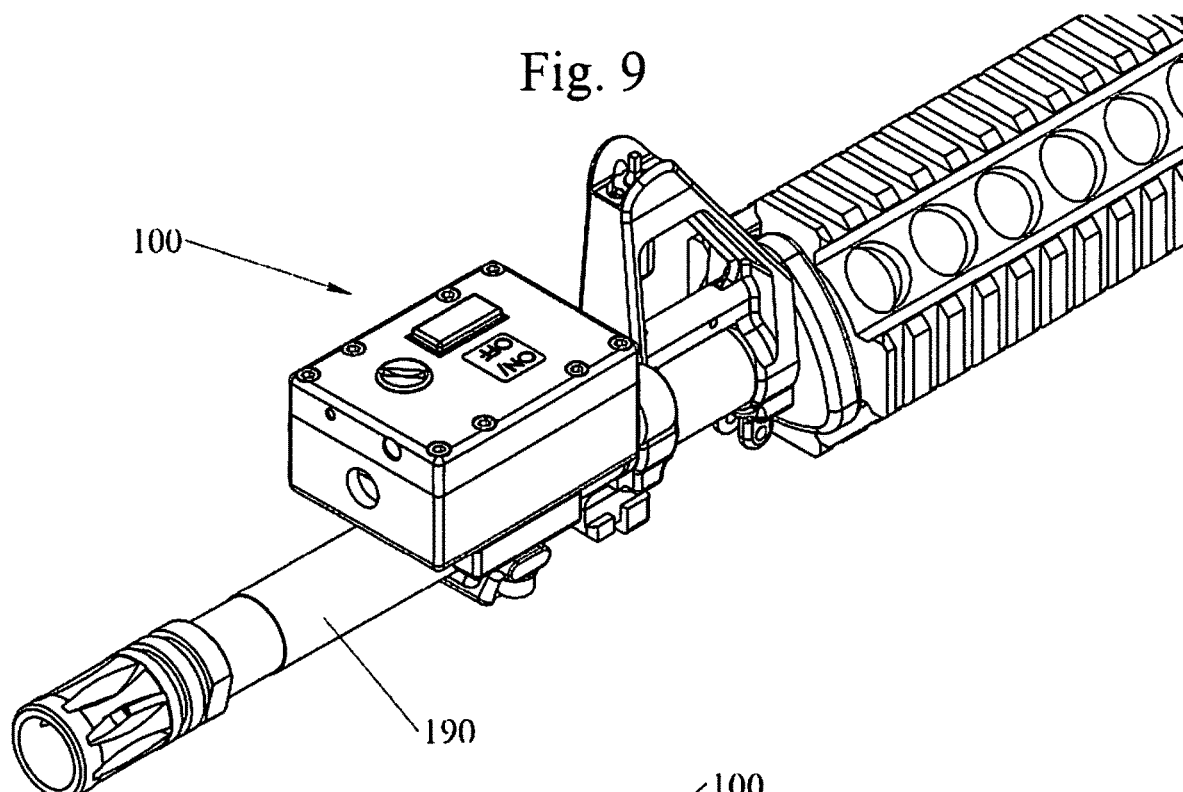
FIG. 9 is an upper front right perspective view of a housing using the laser system of the previous figures mounted to a firearm.
Figure 10:
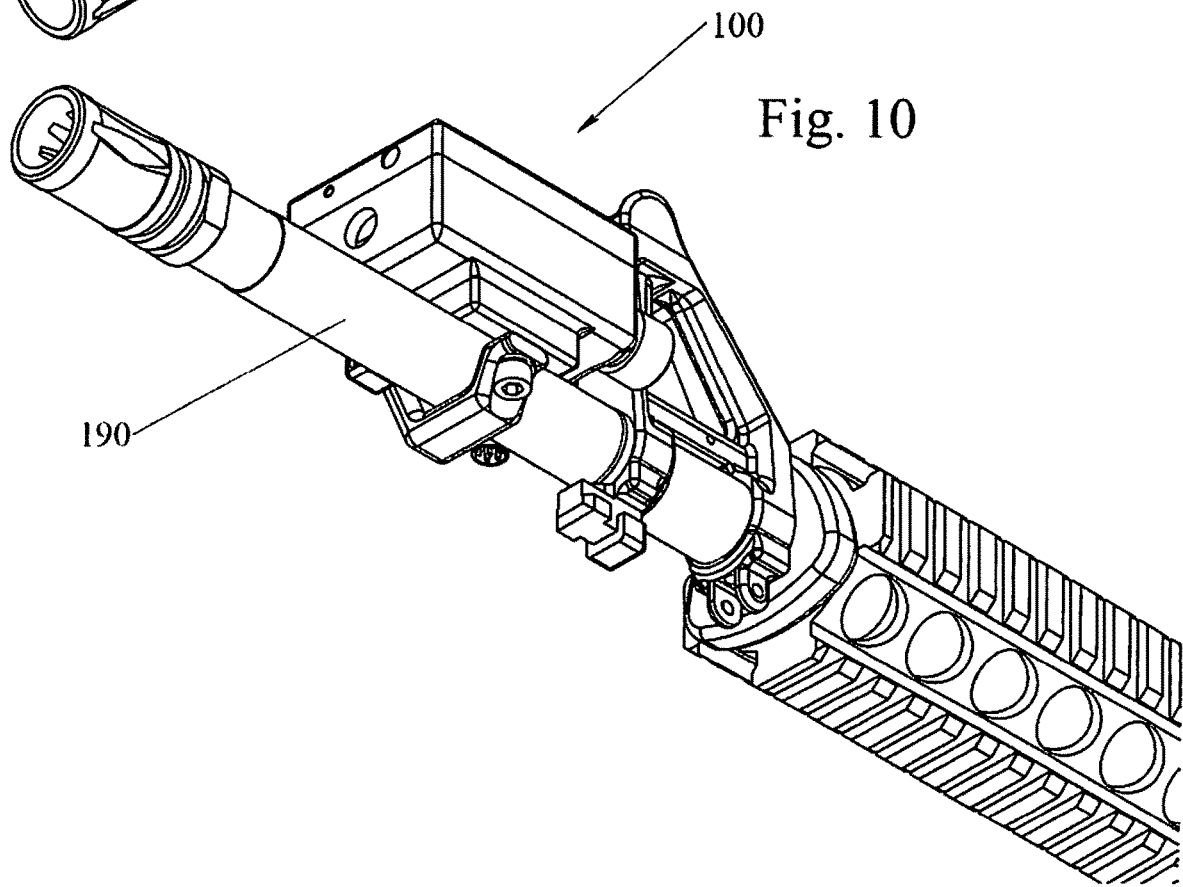
FIG. 10 is a lower front right perspective view of the firearm mounted housing and laser system of FIG. 9.
Figure 11:
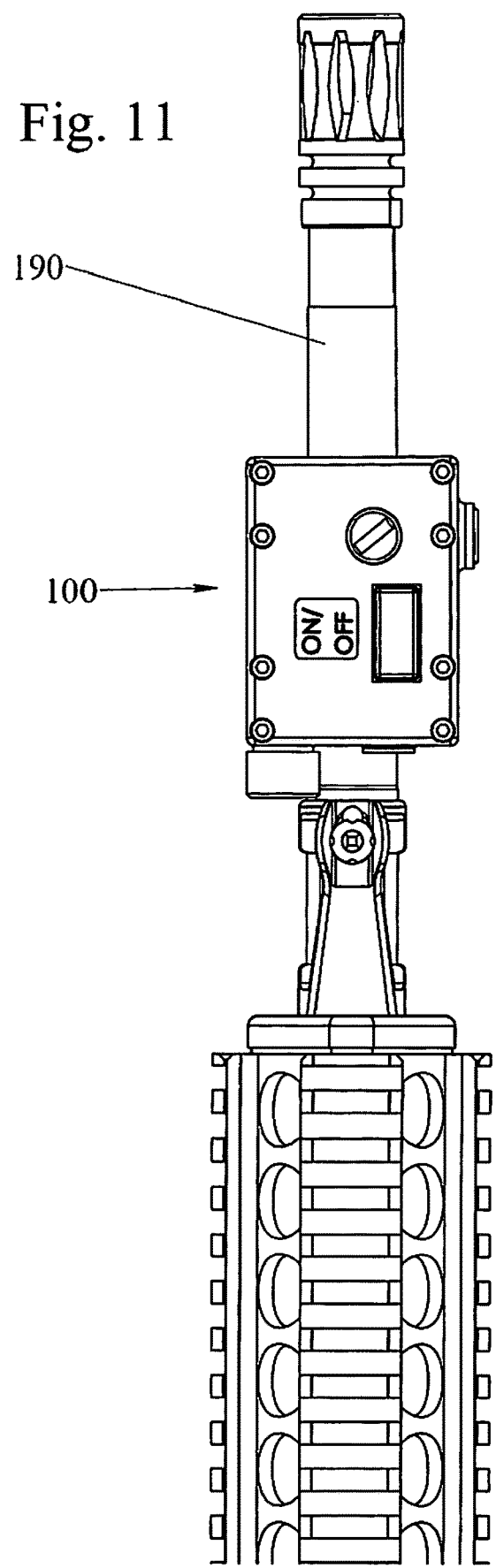
FIG. 11 is a top view of the firearm mounted housing and laser system of FIG. 9.
Figure 12:
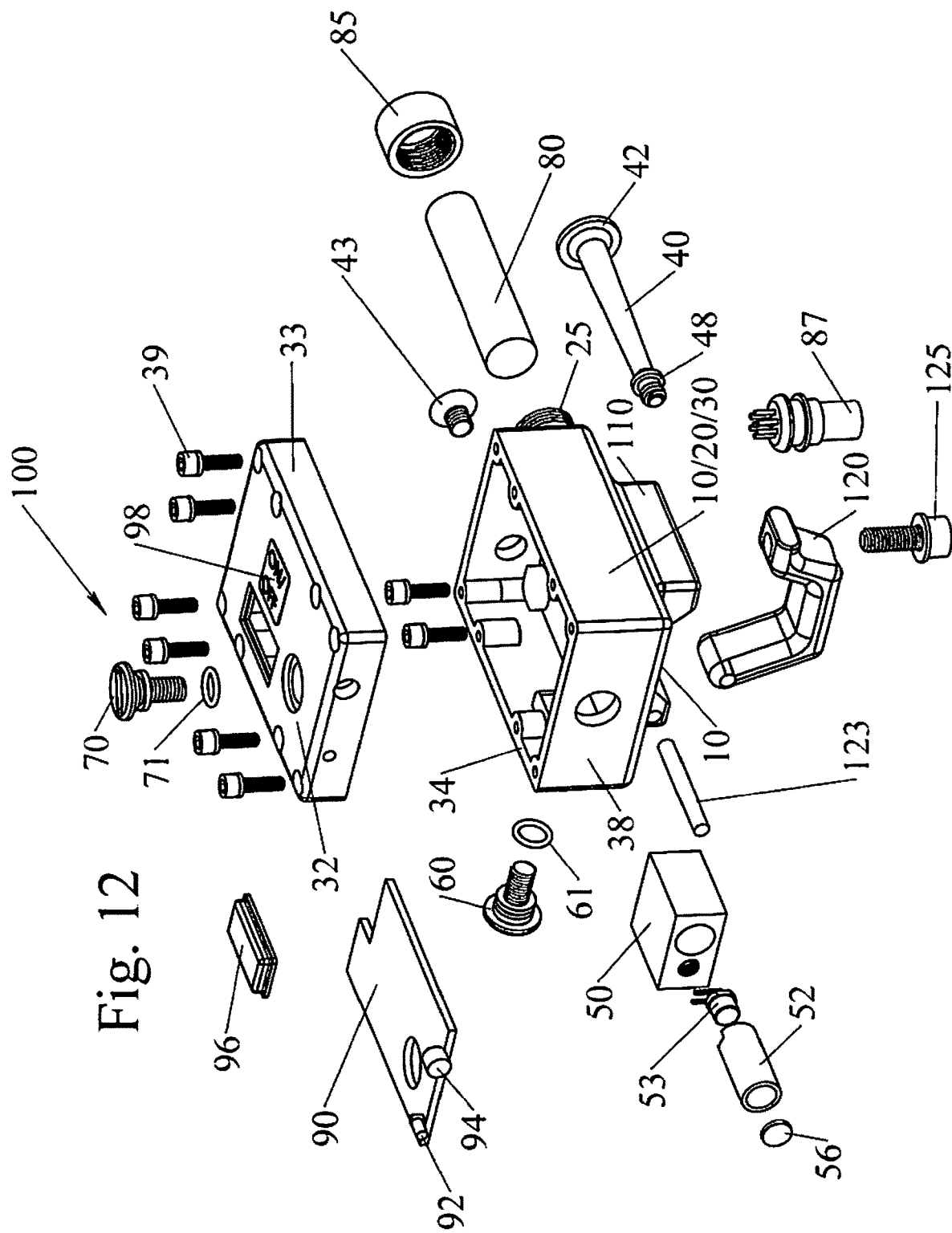
FIG. 12 is an exploded view of the firearm mounted housing and laser system of FIG. 9.

FIG. 9 is an upper front right perspective view of a housing 100 using the laser system 1 of the previous figures mounted to a firearm, such as a rifle barrel 190. FIG. 10 is a lower front right perspective view of the firearm 190 mounted housing 100 and laser system 1 of FIG. 9. FIG. 11 is a top view of the firearm 190 mounted housing 100 and laser system 1 of FIG. 9. FIG. 12 is an exploded view of the firearm 190 mounted housing 100 and laser system 1 of FIG. 9.

Referring to FIGS. 1-12 the laser system 1 can be mounted to a firearm 190 such as to a rifle barrel 190. The rear end 42 of the conical beam 40 can be mounted through the rear wall 20 with the laser housing 50 attached as a payload to the tip end 48 of the cantilevered beam 40. A SAT (small arms transmitter) cover 33 can be placed over an upper opening of a box shaped housing where vertical adjustment control 70 can threadably attach and pass through an opening in the front top 32 of housing, and a lateral adjustment control 60 can threadably attach and pass through an opening in the front side 34 of the housing. Laser tube housing 52 with rear mounted diode 53 and front mounted lens 56 can pass through a front opening in the front wall 38 of the housing. An antenna cover 96 can be mounted to the cover 33, and the laser diode 53 can be controlled by on/off switch 98 which can be powered by battery 80.

CCA is a Circuit Card Assembly, it contains the electronic components that runs the SAT, handles power management, has a processor that runs the software, signal conditions the output of the sensors, tells the laser diode to fire, contains an antenna for wireless communication.

Components 92 and 94 are two of the three different sensors, (the shock signature, flash signature or acoustic signature) that are decoded to determine a valid event Diode 53 is a laser diode which is a semiconductor device that produces coherent radiation (in which the waves are all at the same frequency and phase) in the visible or infrared spectrum when current passes through it. The most common type of laser diode is formed from a p-n junction and powered by injected electric current. Due to diffraction, the beam diverges (expands) rapidly after leaving the chip, typically at 30 degrees vertically by 10 degrees laterally. A lens must be used in order to form a collimated beam like that produced by a laser pointer. If a circular beam is required, cylindrical lenses and other optics are used. For single spatial mode lasers, using symmetrical lenses, the collimated beam ends up being elliptical in shape, due to the difference in the vertical and lateral divergences Connector 87 provides for hooking up a cable to charge the battery and manually operate the SAT. The Switch 98 turns the SAT off and on and is used to set the different modes of operation.

Screws that thread into the housing hold the cover 33 in place. Battery power supply 80 can pass through a threaded opening 25 in the rear wall 20 of the housing and be held in place by a screwable battery cap 85. The housing can be mounted to the rifle barrel 190 by an upper clamp 110 under the housing base 10, and a pivotable clamp 120 having a hinge attached end 123, and a free-moving end that is held in place by a screw and washer 125 that fastens to the housing base 10.

Figure 13:
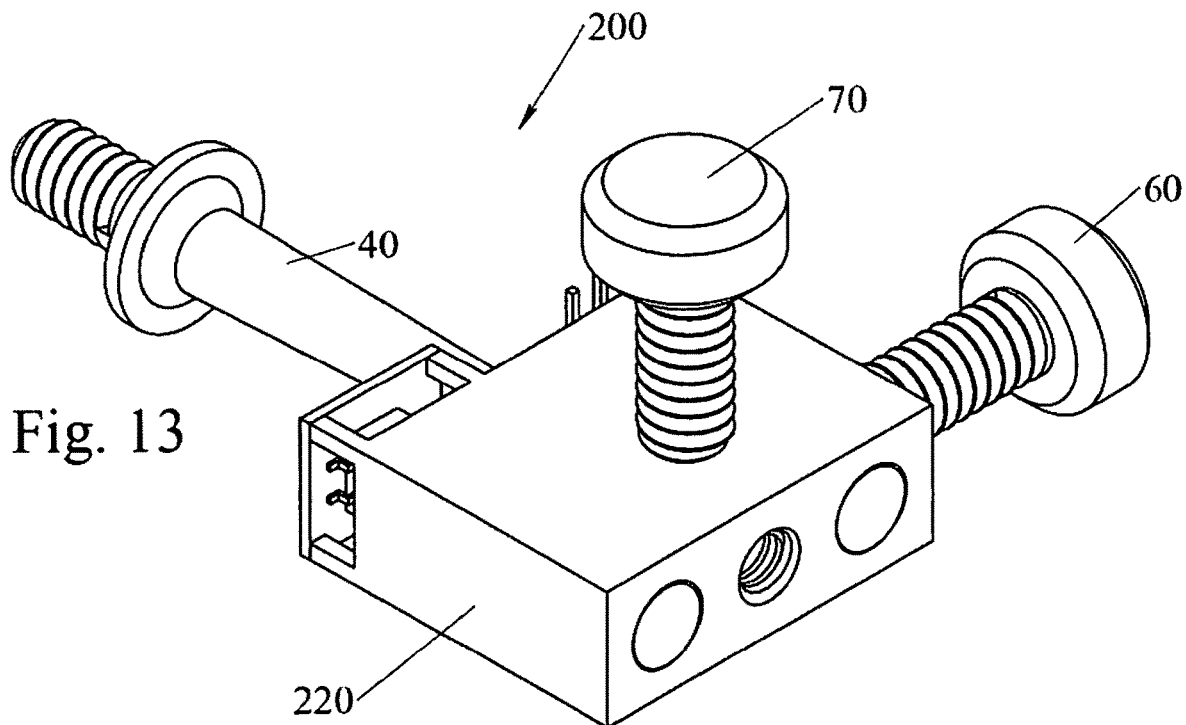
FIG. 13 is a perspective view of a dual laser or laser & detector system.

FIG. 13 is a perspective view of a dual laser or laser and detector payload system 200. The payload 50 of the previous figures can be substituted for another payload being a dual laser or laser and detector payload 220. The other components of the previous figures can be incorporated herein, such as the components 10, 20, 30, 40, 60, 70.

Figure 14:
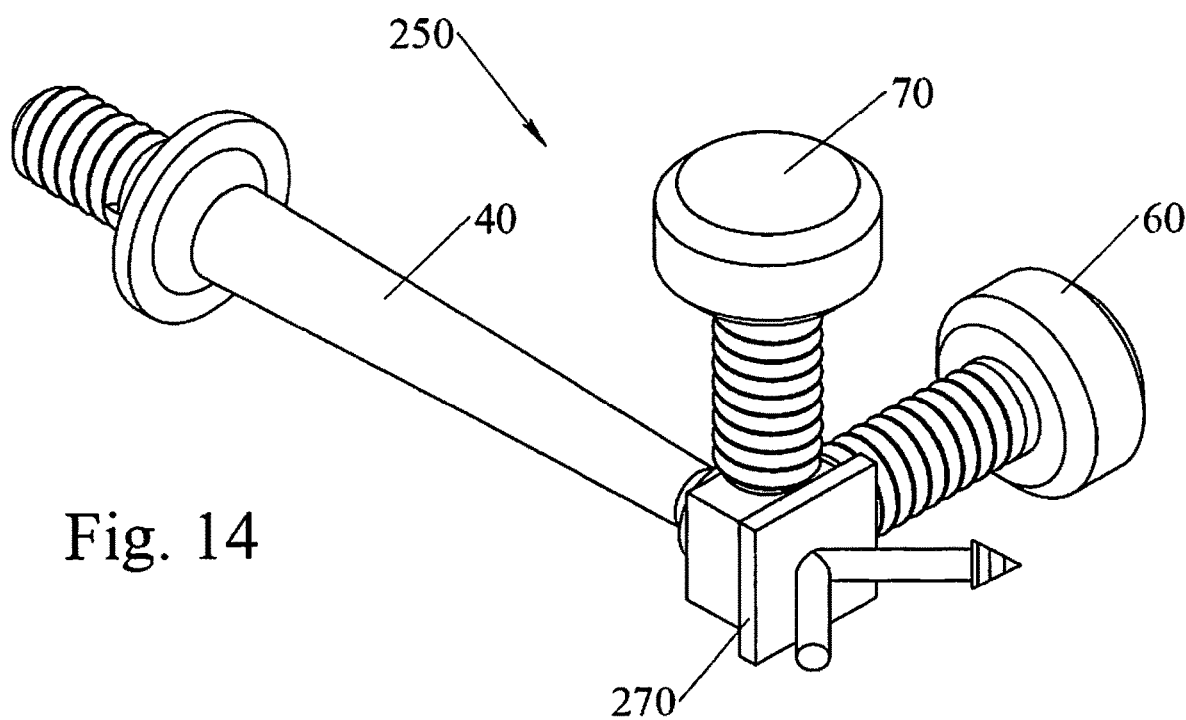
FIG. 14 is a perspective view of a mirror payload system.

FIG. 14 is a perspective view of a mirror payload embodiment system 250. The payload 50 of the previous figures can be substituted for another payload being single mirror payload 270. The other components of the previous figures can be incorporated herein, such as the components 10, 20, 30, 40, 60, 70.

S Shaped Cantilevered Beam

Figure 17:
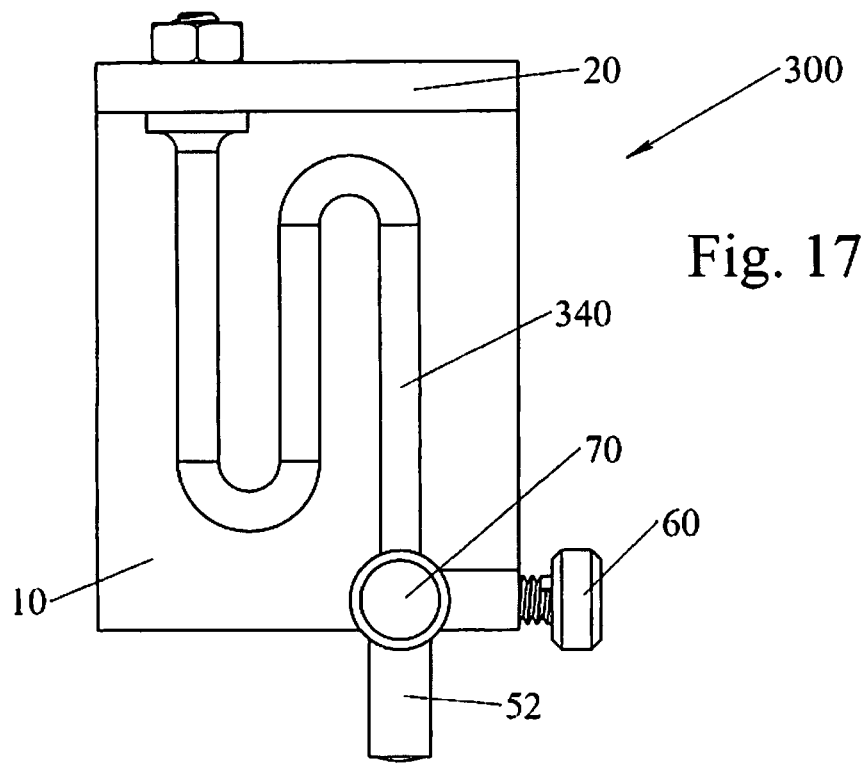
FIG. 17 is a top view of the laser system with S shaped cantilevered beam of FIG. 15.
Figure 18:
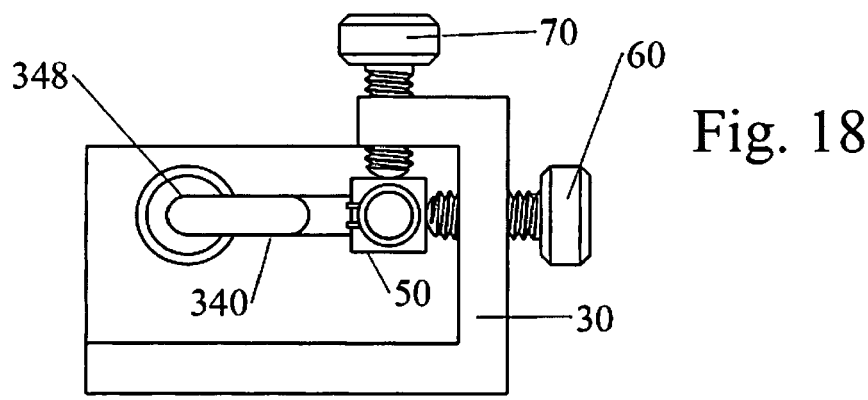
FIG. 18 is a front view of the laser system with S shaped cantilevered beam of FIG. 15.
Figure 19:
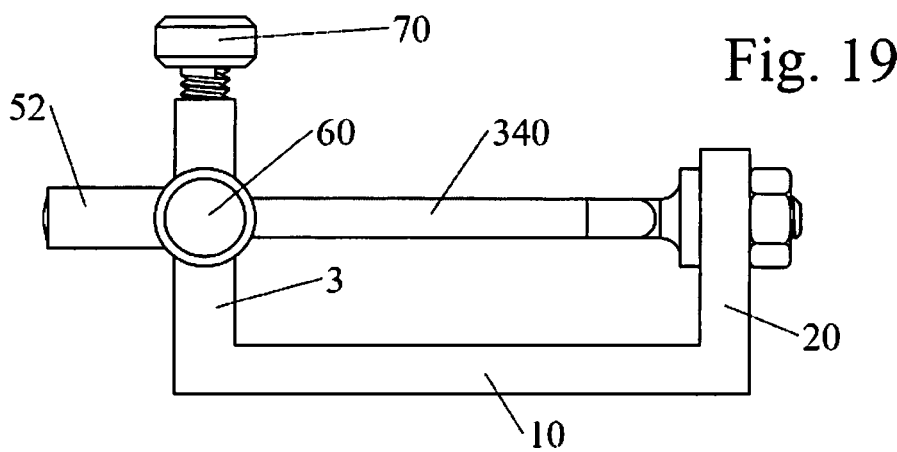
FIG. 19 is a right side view of the system with S shaped cantilevered beam of FIG. 15.
Figure 20:
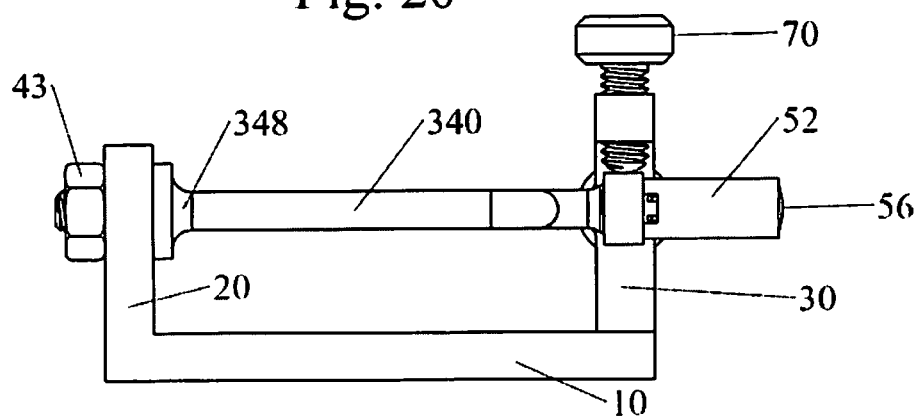
FIG. 20 is a left side view of the laser system with S shaped cantilevered beam of FIG. 15.
Figure 21:
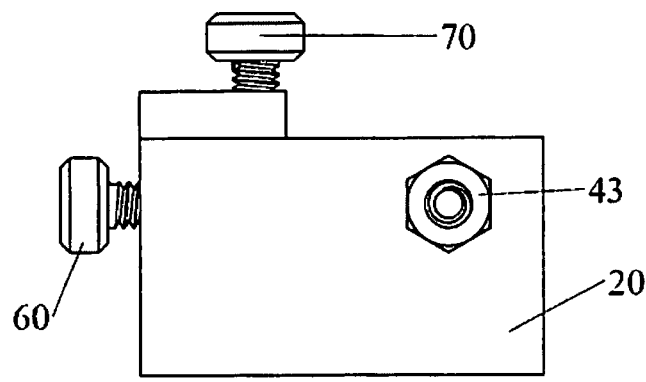
FIG. 21 is a rear view of the laser system with S shaped cantilevered beam of FIG. 15.
Figure 22:
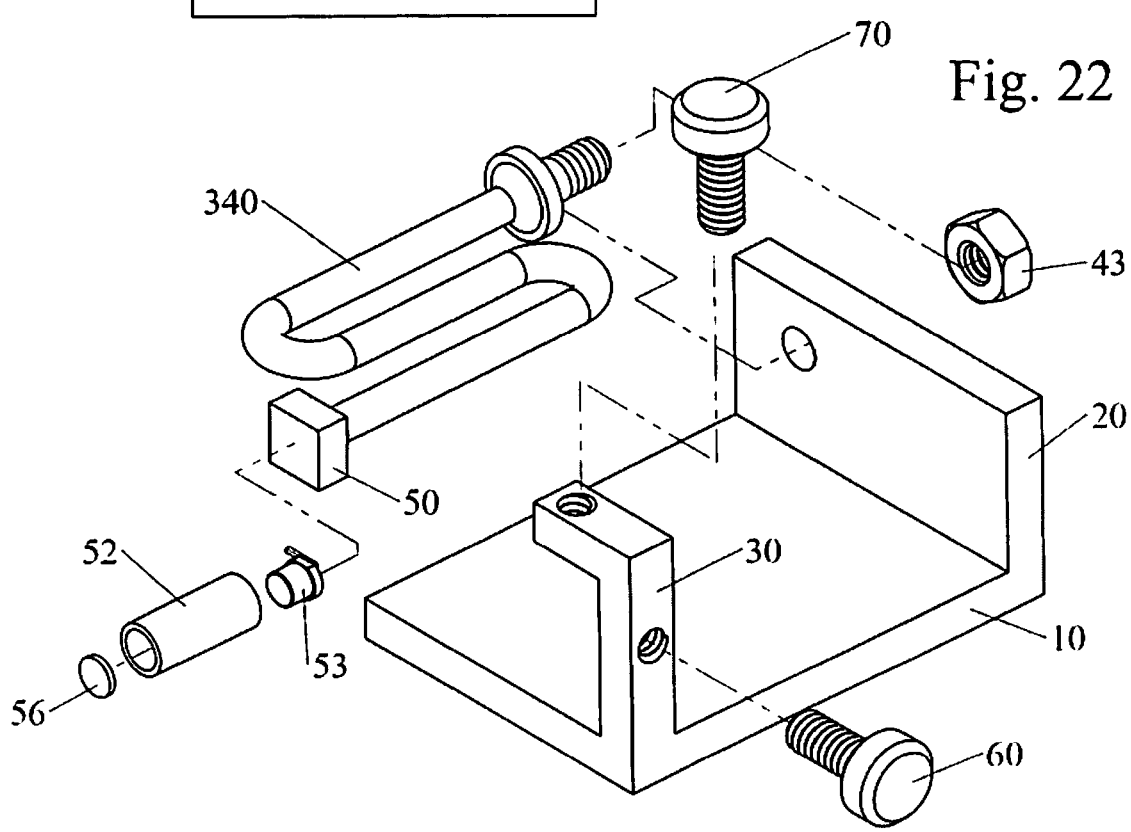
FIG. 22 is an exploded view of the system with S shaped cantilevered beam of FIG. 15.

FIG. 15 is an upper front left perspective view of another single laser system 300 with an S shaped cantilevered beam 340 supporting the laser payload 50. FIG. 16 is an upper front right perspective view of the another single laser system 300 with an S shaped cantilevered beam 340 supporting the laser payload 50 of FIG. 15. FIG. 17 is a top view of the laser system with S shaped cantilevered beam 340 of FIG. 15. FIG. 18 is a front view of the laser system with S shaped cantilevered beam 340 of FIG. 15. FIG. 19 is a right side view of the system with S shaped cantilevered beam 340 of FIG. 15. FIG. 20 is a left side view of the laser system with S shaped cantilevered beam 340 of FIG. 15. FIG. 21 is a rear view of the laser system with S shaped cantilevered beam 340 of FIG. 15. FIG. 22 is an exploded view of the system with S shaped cantilevered beam 340 of FIG. 15.

Referring to FIGS. 15-22, the S shaped cantilevered beam 340 can be solid or hollow, with on end 348 mounted to the rear wall 20 of the housing and a cantilevered front end 342 supporting a payload 50, such as those previously described, wherein the lateral and vertical alignment can be adjustably controlled by rotatable knobs/screws 60, 70, as previously described.

Center Deflecting Cantilevered Beam

Figure 25:
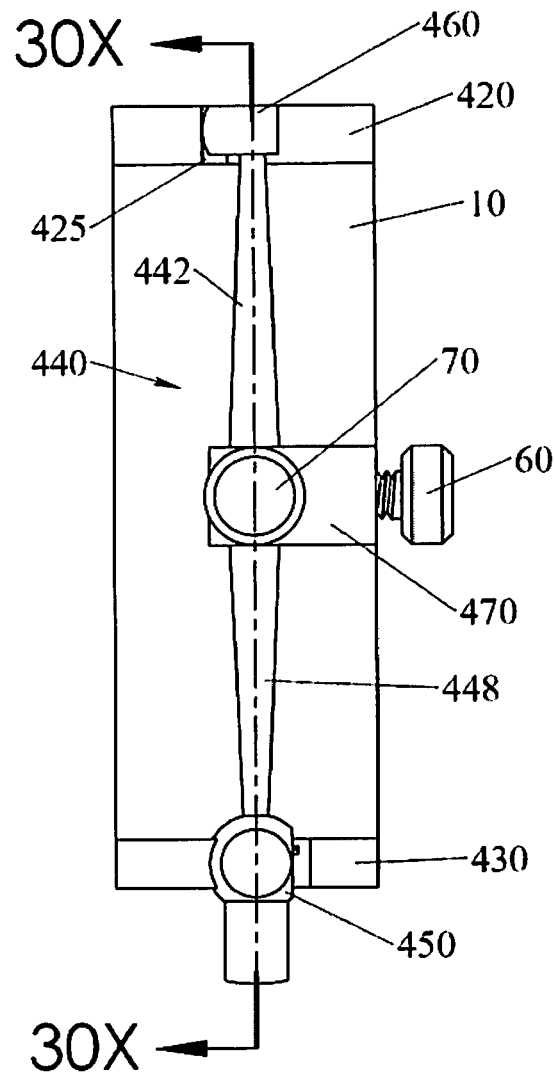
FIG. 25 is a top view of the center deflecting beam supporting the laser of FIG. 23.
Figure 26:
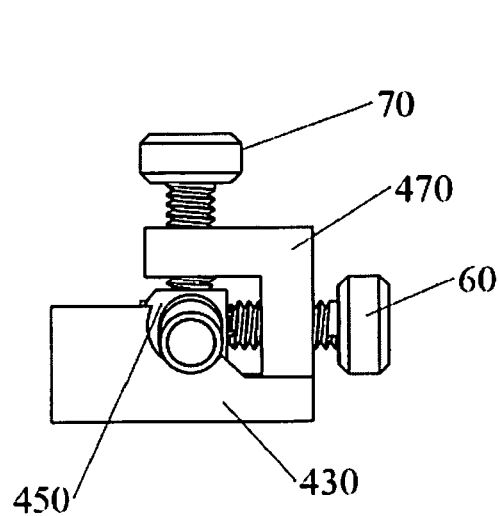
FIG. 26 is a front view of the center deflecting beam supporting the laser of FIG. 23.
Figure 30:
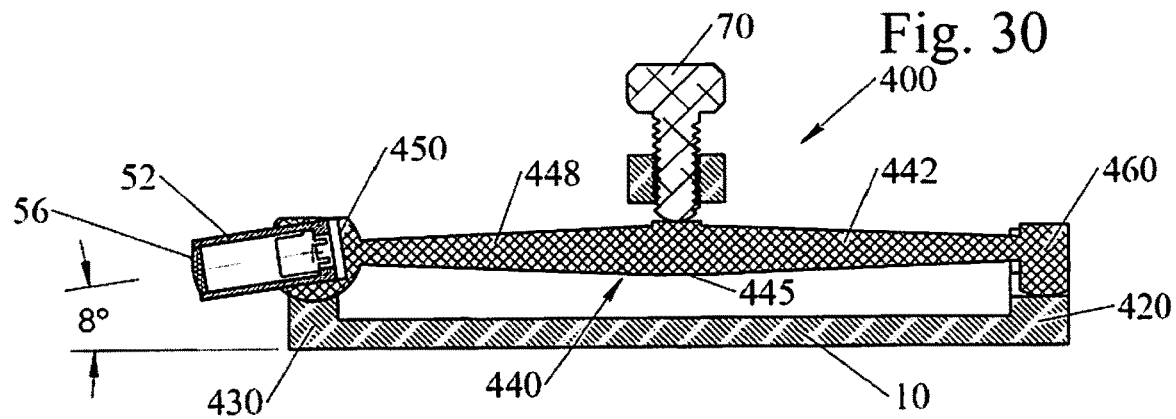
FIG. 30 is a cross-sectional view of the center deflecting beam supporting the laser along arrow 30X of FIG. 25 with the beam in a non-deflected state and boresight pointed down

FIG. 23 is an upper front right perspective view of another single laser system 400 with a center deflecting beam 440 supporting the laser 450. FIG. 24 is an upper front left perspective view of the center deflecting beam 440 supporting the laser 450 of FIG. 23. FIG. 25 is a top view of the center deflecting beam 440 supporting the laser 450 of FIG. 23. FIG. 26 is a front view of the center deflecting beam 440 supporting the laser 450 of FIG. 23. FIG. 27 is a left side view of the center deflecting beam 440 supporting the laser 450 of FIG. 23. FIG. 28 is a right side view of the center deflecting beam 440 supporting the laser 450 of FIG. 23. FIG. 29 is a rear view of the center deflecting beam 440 supporting the laser 450 of FIG. 23. FIG. 30 is a cross-sectional view of the center deflecting beam 440 supporting the laser along arrow 30X of FIG. 25 with the beam 440 in a non-deflected state and boresight pointed down Referring to FIGS. 23-30, the single laser system 400 with center deflecting beam 400 can include similar components to the previous embodiments. Here, the center deflecting beam 440 can have free ends that are not directly mounted to the rear wall 420 or to the front wall 430. The beam 440 can have a middle portion 445, and a rear conical portion 442 with the wide part of the conical portion adjacent to the middle portion 445. The opposite side of the middle beam portion 445 can have a front conical portion 448 with the wide part of the conical portion adjacent to the middle portion 445.

A rear mount support 460 attached to the narrow rear end of the conical portion 442 is freely supported within an opening 425 opening in rear wall 420 with the opening 425 having curved interior surface portion(s). The geometry of 460 prevents 440 from rotating about its axis. The front payload support 450 can be attached to the narrow end of the front conical portion 448 can be freely supported within and opening 435 in the front wall 430 of the housing, wherein the opening 435 can also have curved interior surface portion(s). The focus point of the payload can be located at the center of the spherical 450 geometry and there is not linear translation during alignment, only angular movement. A C shaped portion 470 of the housing can be located adjacent to the middle portion 445 of the beam 440, wherein the lateral adjustment control 460 and vertical adjustment control 470 can each cause the beam 440 to deflect laterally and vertically when needed. The laser support module housing 450 can have at least a lower spherical surface that can slide within the curved interior surface of the opening 435 of the front wall.

Figure 31:
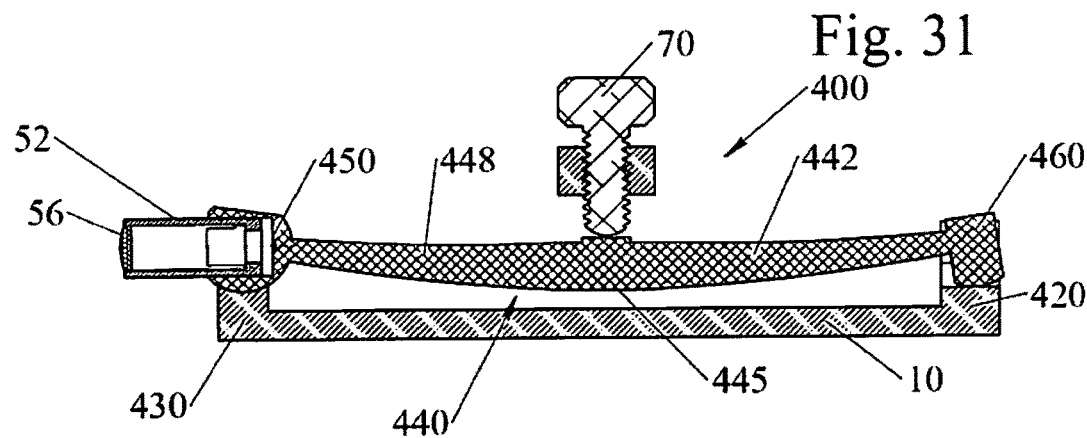
FIG. 31 is another cross-sectional view of the center deflecting beam supporting the laser module of FIG. 30 with the beam deflected down and boresight pointed straight ahead.
Figure 32:
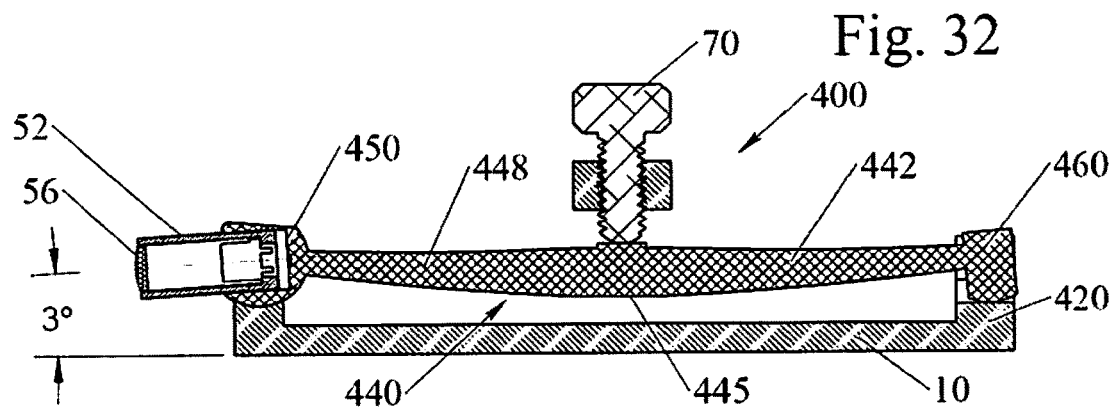
FIG. 32 is another cross-sectional view of the center deflecting beam supporting the laser module of FIG. 30 with the beam deflected down and boresight pointed partially down.
Figure 33:
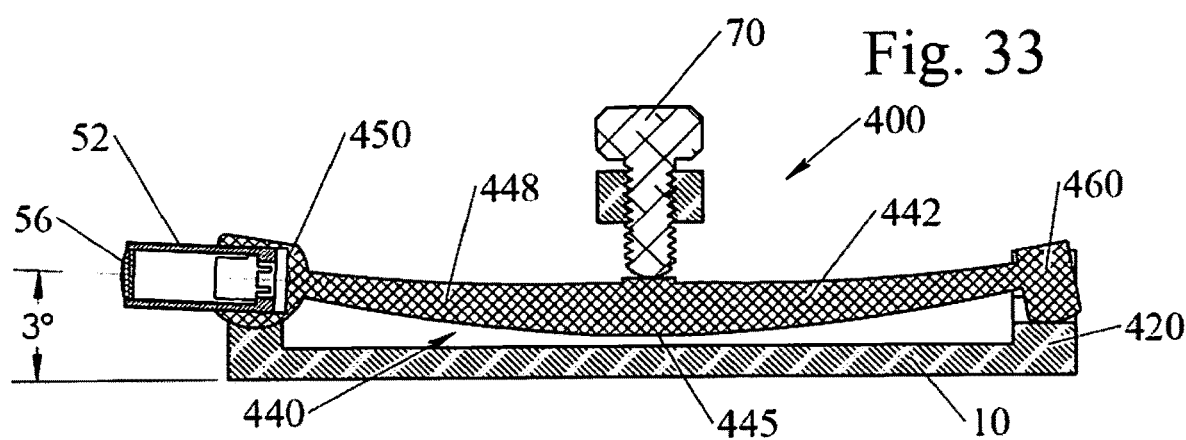
FIG. 33 is another cross-sectional view of the center deflecting beam supporting the laser module of FIG. 30 with the beam deflected fully down and boresight pointed up.

FIG. 31 is another cross-sectional view of the center deflecting beam 440 supporting the laser module housing 450 of FIG. 30 with the beam 440 deflected down by the vertical adjustment control 70 with the boresight pointed straight ahead. FIG. 32 is another cross-sectional view of the center deflecting beam 440 supporting the laser module housing 450 of FIG. 30 with the beam 440 deflected down and boresight pointed partially down. FIG. 33 is another cross-sectional view of the center deflecting beam 440 supporting the laser module housing 450 of FIG. 30 with the beam 440 deflected fully down and boresight pointed up.

Housing Bias Angle and Preload

The bias angle can be driven by two design requirements. The first is the vertical and lateral adjustment range from the mechanical boresight when the payload's centerline(s) are parallel to the base centerline. The second is the lateral and vertical preload forces produced by the conical element acting on the housing over the full adjustment range are greater than the lateral and vertical forces produced by the acceleration level in each axis multiplied times the mass of the housing and the effective mass of the conical element.

The plus and minus adjustment range in each axis from mechanical boresight needs to take into accord any manufacturing tolerances in the SAT assembly, the angular mechanical offsets in the weapon and the angular error associated with the shooter's sight picture.

The maximum bias angle in each axis is greater than the deflection angle required by the conical element at minimum deflection of the housing from the free state that produces a force greater than the unloading force plus two times the plus/minus adjustment range from the mechanical boresight.

Figure 34:
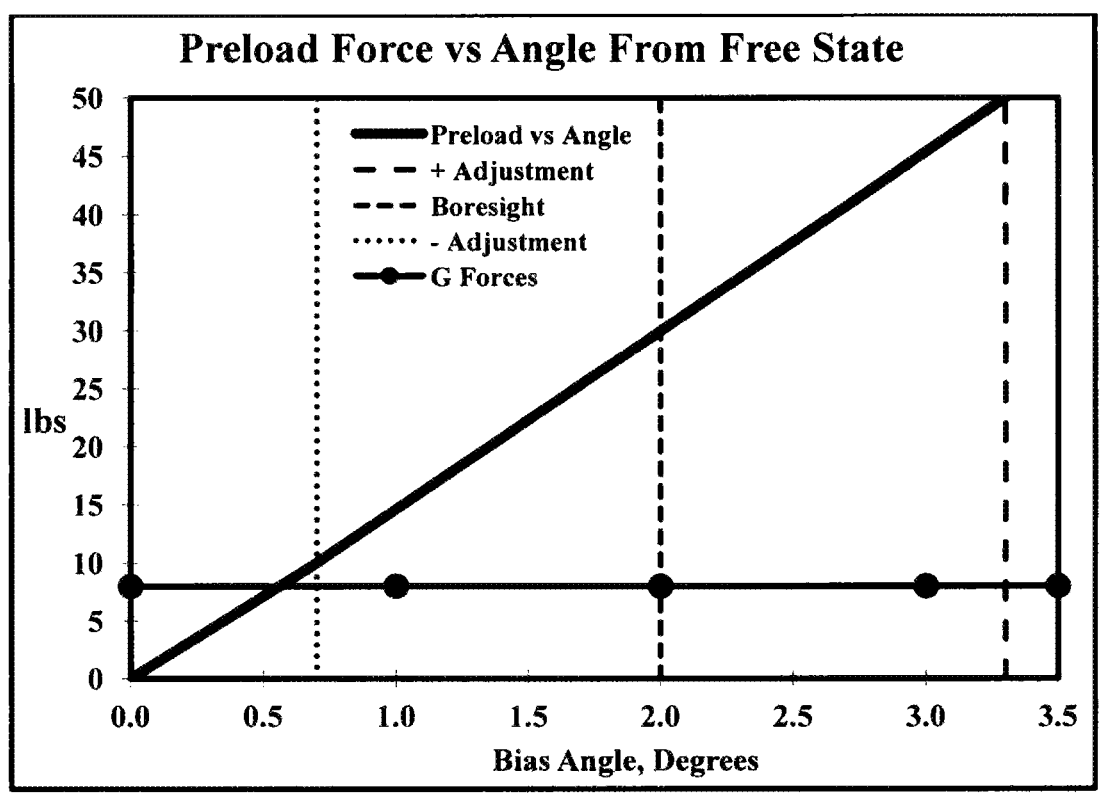
FIG. 34 is a graph showing the relationship between the preload forces over adjustment angle verses the peak forces due to the acceleration.

FIG. 34 shows an example of the relationship between the preload forces over adjustment angle vs. the peak forces due to the acceleration, actual values will vary from system to system.

Figure 35:
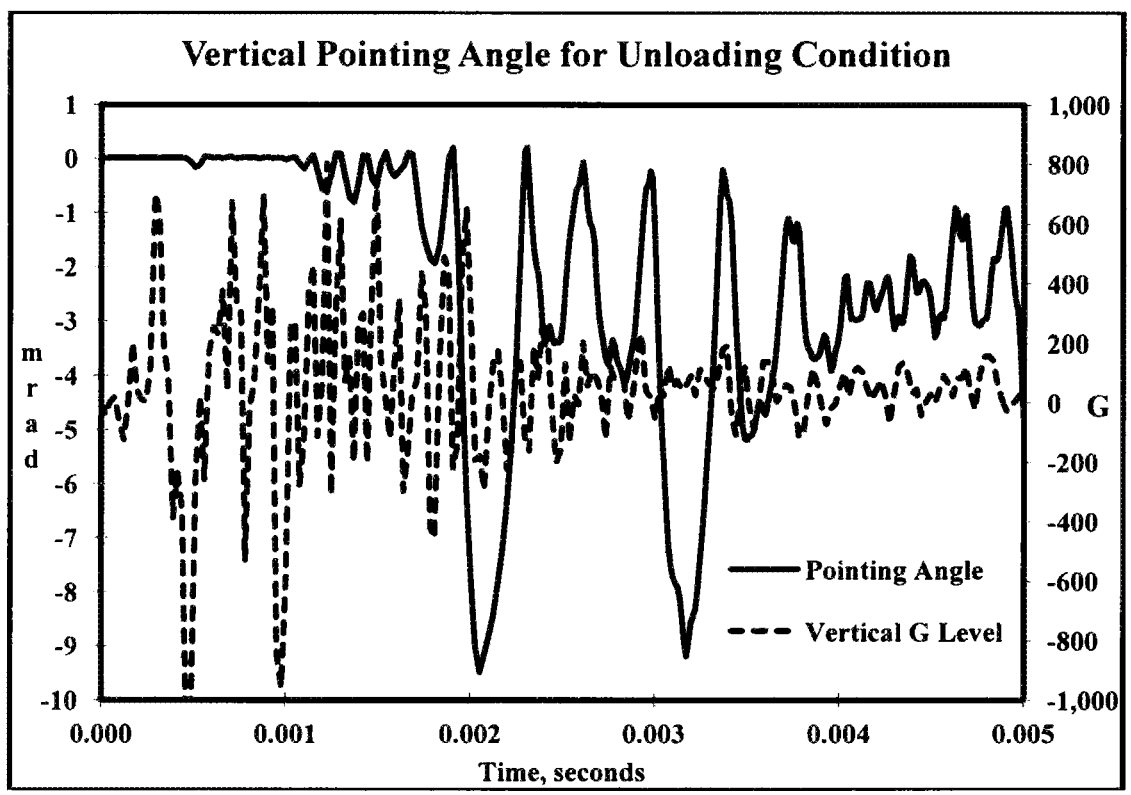
FIG. 35 shows the vertical pointing angle for unloading condition with the mill radians (mrad) pointing error in one axis for a system that unloads during the shock event.

FIG. 35 shows the milliradian (mrad) pointing error in one axis for a system that unloads during a shock event. The housing holding the laser moves away from the hard adjustment elements toward the spring and then unloads and starts bouncing and the error increases to unacceptable levels during the time period of interest, i.e when the laser needs to be fired.

Figure 36:
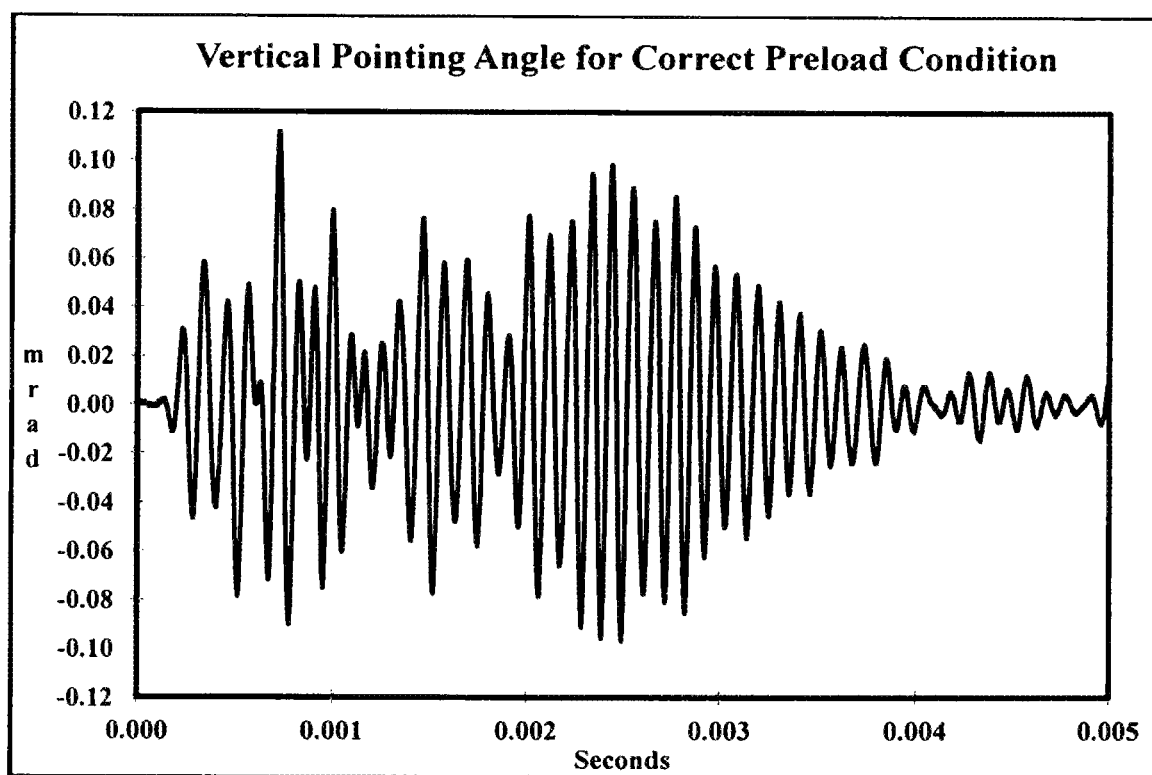
FIG. 36 shows the pointing angle for correct preload condition with the mrad pointing error in one axis for a system that does not unload during the shock event.

FIG. 36 shows the mrad pointing error in one axis for the same system that does not unload during the same shock event, the preload has been increased above the G force level. The housing does not move away from the hard adjustment element and the pointing error is defined by the slope of the conical element at the attachment point to the housing. The slope is governed by the conical element bending between the fixed end at the base and the simply supported end at the housing due to the acceleration load.

Figure 37:
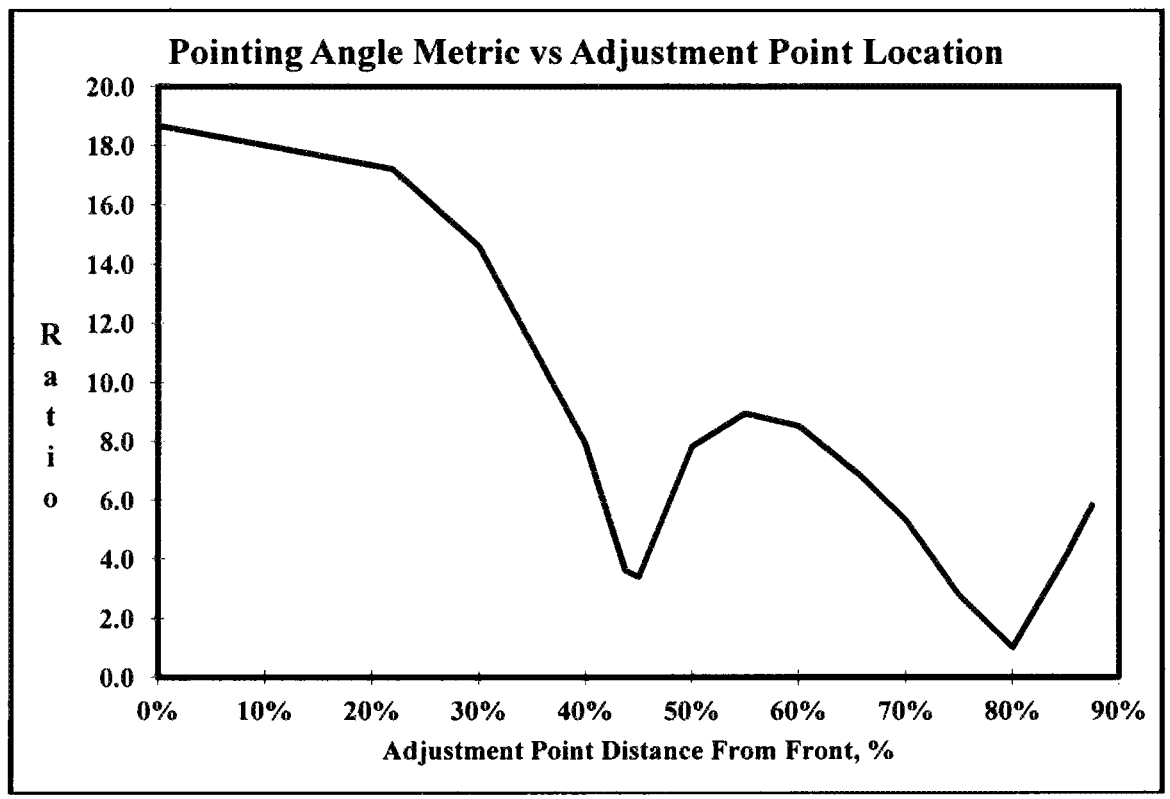
FIG. 37 shows the pointing angle metric verses adjustment point location.

The angular pointing error vs. time shown in FIG. 36 is when the adjustment element is located 45% of the housing length from the front of the housing. The pointing error can be reduced or minimized by moving the adjustment element location to 80% from the front of the housing, see FIG. 37. When the Center of Gravity (CG) of the housing is in front of the adjustment point, the force from the housing mass multiplied times the acceleration level produces a bending moment and deflection in the cantilever element opposite the bending moment and deflection in the cantilever element produced by the same acceleration level acting only on the cantilever element.

FIG. 38 is a perspective view of a cam version 500 of the invention. FIG. 39 is another perspective view 500 of the cam version of FIG. 38. The operator rotates the external knobs which rotate the cams 510, 520 pushes against the payload, which moves the payload along the vertical and horizontal axis.

While the payload 50 has been described as a laser module, other types of payloads can be used, such as but not limited to a passive receiving elements such as television or electromagnetic spectrum detectors, reflective elements such as optical or electromagnetic spectrum reflectors, active elements such as electromagnetic spectrum transmitters, optical elements that can include refractive or diffractive or reflective optical elements, and. indicator or probe components for measuring.

Although rotating knobs and screws can be used other types of vertical and lateral adjustment controls, can be used such other types of threaded elements, cams or levers, or wedges The adjustments could be manual or servo or remotely controlled. The activation could be by electrical, magnetic, thermal, hydraulic or pneumatic actuators. The linear adjustment for each axis(s) can increase or decrease the angular displace relative to the linear adjustment elements. The linear adjustment elements could be actuators, such as solenoids. The threaded elements can employ different thread pitches or differential threaded components to increase or decrease the angular displacement relative to the linear displacement. Bimetallic materials can be used in the adjustment mechanisms. The contact surface between the adjustment element and the housing is curved to minimize the friction and to minimize the pointing errors as the housing moves and rotates relative to the adjustment element.

Different kinematic interfaces can be used at the mating points to reduce errors as required by the system requirements. Typical types of kinematic interfaces include but not limited to; Kelvin clamp, trihedral cup, gothic arch, v-blocks, conical cup, split kinematics to minimize Abbe offset issues, canoe sphere and v-block, flat prismatic components, rose bud couplings and knife edge.

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

I claim:

1. A pointing support device for high shock environments, comprising:
    a housing having a base, a front stationary wall and a rear stationary wall, the front stationary wall having an opening;
    a one piece shaped beam comprising a base first end rigidly mounted and fixed directly to the rear stationary wall, and a tip second end aligned with and adjacent to the opening in the front stationary wall, and a section intermediate the first end and the second end that has a parabolic shaped profile;
    a pointing payload rigidly and fixedly attached to the second end of the one piece shaped beam, wherein the one piece shaped beam provides accurate linear and angular positioning of the payload and maintains initial precise pointing of the payload relative to the pointing device during and after exposure of the housing to shock and vibration; and
    an externally accessible vertical and lateral adjustment mechanism comprising a vertical adjustment component and a lateral adjustment component, the adjustment mechanism directly coupled to the pointing payload for adjusting a vertical and a lateral position of the payload along vertical and lateral orientations.

2. The pointing support device of claim 1, wherein the one piece shaped beam is a hollow shaped beam.

3. The pointing support device of claim 1, wherein the one piece shaped beam is a solid non-cylindrical shaped beam.

4. The pointing support device of claim 1, wherein the pointing payload includes:
   a laser module mounted on a firearm.

5. The pointing device of claim 1, wherein the vertical adjustment component and the lateral adjustment component comprises:
   only one single rotatable vertical control and only one single rotatable lateral control rotatable from an exterior of the pointing support device for adjusting said vertical and lateral position of the payload without disassembly.

6. The pointing device of claim 5, wherein the only one single rotatable vertical control and the only one single rotatable lateral control comprises:
   a vertical cam control and a lateral cam control for adjusting said vertical and lateral position of the payload.

7. The pointing support device of claim 1, wherein the pointing payload is selected from the group consisting of a dual laser payload and a laser and detector payload.

8. The pointing support device of claim 1, wherein the pointing payload includes an optical mirror payload.

9. The pointing support device of claim 1, wherein the one piece shaped beam is fabricated of a material selected from a group consisting of metal, plastic, and composite.

10. A pointing support device for high shock environments, comprising:
    a housing having a base, a front stationary wall and a rear stationary wall, the front stationary wall having an opening;
    a one piece shaped beam comprising a base first end rigidly mounted and fixed directly to the rear stationary wall, and a tip second end aligned with and adjacent to the opening in the front stationary wall, and a section intermediate the first end and the second end that has a parabolic shaped profile;
    a pointing payload rigidly attached to the second end of the one piece shaped beam, wherein the one piece shaped beam provides accurate linear and angular positioning of the payload and maintains initial precise pointing of the payload relative to the pointing device during and after exposure of the housing to shock and vibration; and
    an externally accessible vertical and lateral adjustment mechanism comprising a vertical adjustment component and a lateral adjustment component, the adjustment mechanism directly coupled to the pointing payload for adjusting a vertical and a lateral position of the payload.

11. The pointing device of claim 10, wherein the pointing payload includes:
    passive receiving elements selected from a group consisting of a television and electromagnetic spectrum detectors.

12. The pointing device of claim 10, wherein the pointing payload includes:
    a reflective element selected from the group consisting of optical and electromagnetic spectrum reflectors.

13. The pointing device of claim 10, wherein the vertical adjustment component and the lateral adjustment component comprises:
    only one single rotatable vertical control and only one single rotatable lateral control rotatable on an exterior of the pointing support device for adjusting said vertical and lateral position of the payload without disassembly.

14. The pointing support device of claim 10, wherein the pointing payload includes:
    a laser module mounted on a firearm.

15. The pointing device of claim 10, wherein the vertical adjustment component and the lateral adjustment component comprises:
    only one vertical cam control and only one lateral cam control for adjusting the payload.

16. The pointing support device of claim 10, wherein the pointing payload is selected from the group consisting of a dual laser payload and a laser and detector payload.

17. The pointing support device of claim 10, wherein the pointing payload includes an optical mirror payload.

18. The pointing support device of claim 10, wherein the one piece shaped beam is fabricated of a material selected from a group consisting of metal, plastic, and composite.

19. A pointing support apparatus for high shock environments, comprising:
    a housing having a base, a front stationary wall and a rear stationary wall, the front stationary wall having an opening;
    a one piece shaped beam comprising a base first end rigidly mounted and fixed directly to the rear stationary wall, and a tip second end aligned with and adjacent to the opening in the front stationary wall, and a section intermediate the first end and the second end that has a parabolic profile;
    a pointing payload rigidly attached to the second end of the one piece shaped beam, wherein the one piece shaped beam provides accurate linear and angular positioning of the payload and maintains initial precise pointing of the payload relative to the pointing device during and after exposure of the housing to shock and vibration; and
    an externally accessible vertical and lateral adjustment mechanism comprising a vertical adjustment control and a lateral adjustment control, the adjustment mechanism directly coupled to the pointing payload for adjusting a vertical and a lateral position of the payload.

\* \* \* \* \*